(12) United States Patent
Iinuma

(10) Patent No.: US 8,569,825 B2
(45) Date of Patent: Oct. 29, 2013

(54) NONVOLATILE SEMICONDUCTOR STORAGE DEVICE

(75) Inventor: Toshihiko Iinuma, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 531 days.

(21) Appl. No.: 12/881,510

(22) Filed: Sep. 14, 2010

(65) Prior Publication Data
US 2011/0233645 A1 Sep. 29, 2011

(30) Foreign Application Priority Data

Mar. 24, 2010 (JP) ................................. 2010-068465

(51) Int. Cl.
H01L 29/792 (2006.01)
G11C 11/34 (2006.01)

(52) U.S. Cl.
USPC ............... 257/324; 257/314; 257/E29.309; 365/185.18; 365/185.27

(58) Field of Classification Search
USPC ............ 257/314, 324, E29.309; 365/185.18, 365/185.27
See application file for complete search history.

(56) References Cited

U.S. PATENT DOCUMENTS

| 7,847,334 | B2 | 12/2010 | Katsumata et al. | |
|---|---|---|---|---|
| 7,927,926 | B2 | 4/2011 | Katsumata et al. | |
| 8,288,823 | B2 * | 10/2012 | Ernst et al. | 257/365 |
| 8,319,275 | B2 * | 11/2012 | Shim et al. | 257/324 |
| 8,324,675 | B2 * | 12/2012 | Moon et al. | 257/314 |
| 2008/0073635 | A1 | 3/2008 | Kiyotoshi et al. | |
| 2009/0242967 | A1 | 10/2009 | Katsumata et al. | |

FOREIGN PATENT DOCUMENTS

| JP | 2008-42206 | 2/2008 |
|---|---|---|
| JP | 2008-78404 | 4/2008 |
| JP | 2008-186868 | 8/2008 |
| JP | 2008-311641 | 12/2008 |
| JP | 2009-88446 | 4/2009 |
| JP | 2009-117843 | 5/2009 |
| JP | 2009-224465 | 10/2009 |

OTHER PUBLICATIONS

Office Action issued Jul. 24, 2012 in Japanese Application No. 2010-068465 (With English Translation).
H. Tanaka, et al., "Bit Cost Scalable Technology with Punch and Plug Process for Ultra High Density Flash Memory", Symposium on VLSI Technology Digest of Technical Papers, 2007, pp. 14-15.
Wonjoo Kim, et al., "Multi-Layered Vertical Gate NAND Flash Overcoming Stacking Limit for Terabit Density Storage", Symposium on VLSI Technology Digest of Technical Papers, 2009, pp. 188-189.

* cited by examiner

Primary Examiner — Kenneth Parker
Assistant Examiner — Jose R Diaz
(74) Attorney, Agent, or Firm — Oblon, Spivak, McClelland, Maier & Neustadt, L.L.P.

(57) ABSTRACT

According to one embodiment, a manufacturing method of a nonvolatile semiconductor storage device, includes: forming a plurality of structures above a semiconductor substrate, each of the plurality of structures being such that in a stacked film where a plurality of first semiconductor films and a plurality of second semiconductor films are stacked alternately at least the second semiconductor films are held by a semiconductor or conductor pillar member via a gate dielectric film; selectively removing the first semiconductor films from the stacked film while maintaining a state where the second semiconductor films are held by the pillar member for each of the structures; oxidizing an exposed surface for each of the structures after removing the first semiconductor films; and embedding an inter-layer dielectric film between the plurality of structures in which the exposed surface is oxidized.

6 Claims, 16 Drawing Sheets

# NONVOLATILE SEMICONDUCTOR STORAGE DEVICE

CROSS-REFERENCE TO RELATED APPLICATIONS

This application is based upon and claims the benefit of priority from the prior Japanese Patent Application No. 2010-068465, filed on Mar. 24, 2010; the entire contents of which are incorporated herein by reference.

FIELD

Embodiments described herein relate generally to a manufacturing method of a nonvolatile semiconductor storage device and a nonvolatile semiconductor storage device.

BACKGROUND

In a nonvolatile semiconductor storage device, specially, a highly-integrated memory such as a flash memory, a demand for high integration of memory elements (memory cells) is increasing, and a product in which a fine element whose minimum feature size is about 30 nm or less is used has been developed. Improvement of integration by reducing the minimum feature size is reaching a physical limit such as increase in variation of a transistor operation in the element, and is reaching an economic limit such as rapid increase in cost for a lithography process and a fabrication process. Therefore, it is required to introduce a technology of arranging the memory elements (memory cells) three-dimensionally for realizing higher integration.

In the three-dimensional array of the memory cells (transistors), if the interval between the transistors adjacent in a vertical direction is made small for improving an arrangement density of the memory cells (transistors), interference between the transistors adjacent in the vertical direction cannot be ignored. Consequently, the transistor may malfunction.

On the other hand, if the interval between the transistors adjacent in the vertical direction is made large for attenuating the interference between the transistors adjacent in the vertical direction, it becomes difficult to improve the arrangement density of the memory cells (transistors).

DETAILED DESCRIPTION

According to one embodiment, there is provided a manufacturing method of a nonvolatile semiconductor storage device, comprising: forming a plurality of structures above a semiconductor substrate, each of the plurality of structures being such that in a stacked film where a plurality of first semiconductor films and a plurality of second semiconductor films are stacked alternately at least the second semiconductor films are held by a semiconductor or conductor pillar member via a gate dielectric film; selectively removing the first semiconductor films from the stacked film while maintaining a state where the second semiconductor films are held by the pillar member for each of the structures; oxidizing an exposed surface for each of the structures after removing the first semiconductor films; and embedding an inter-layer dielectric film between the plurality of structures in which the exposed surface is oxidized.

Exemplary embodiments of a configuration and a manufacturing method of a nonvolatile semiconductor storage device will be explained below in detail with reference to the accompanying drawings. The scope of the present invention is not limited to the following embodiments.

First Embodiment

Figure 1A:
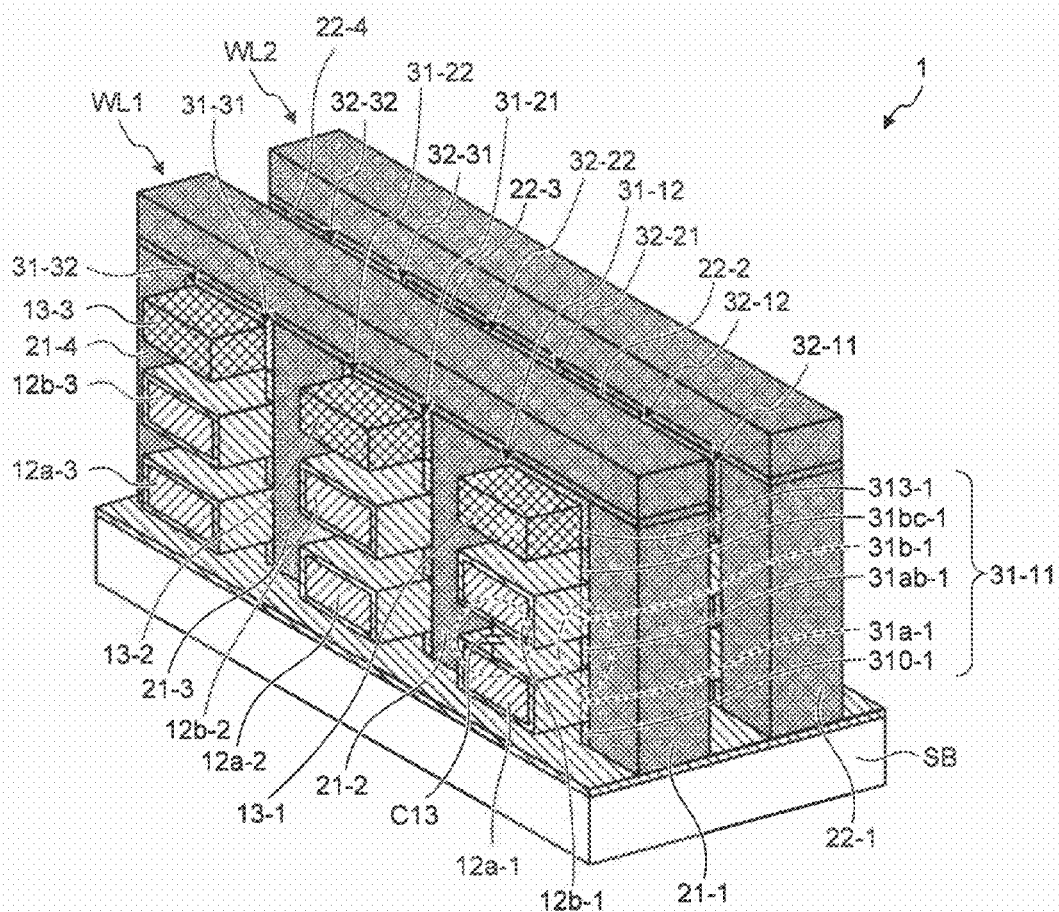
FIG. 1A and FIG. 1B are diagrams illustrating a configuration of a nonvolatile semiconductor storage device according to a first embodiment.
Figure 1B:
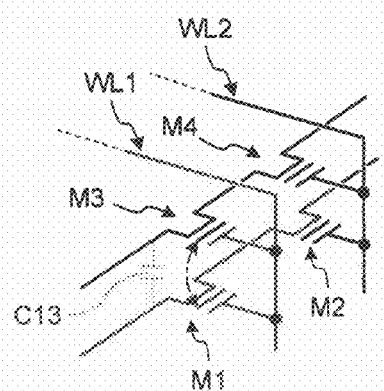
Figure 2A:
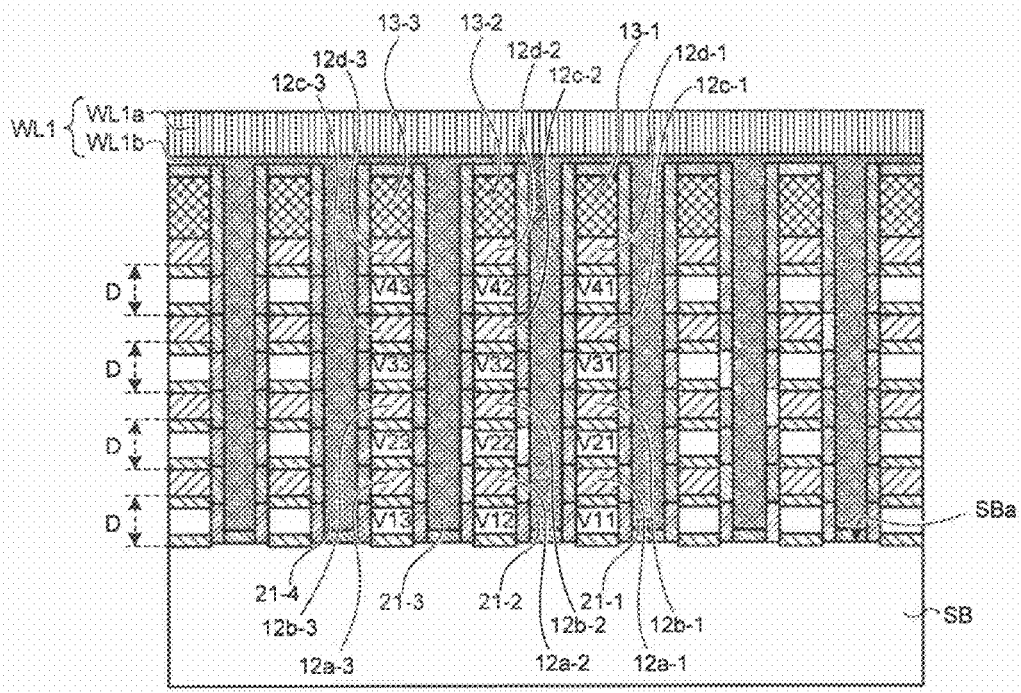
FIG. 2A and FIG. 2B are diagrams illustrating the configuration of the nonvolatile semiconductor storage device according to the first embodiment.
Figure 2B:
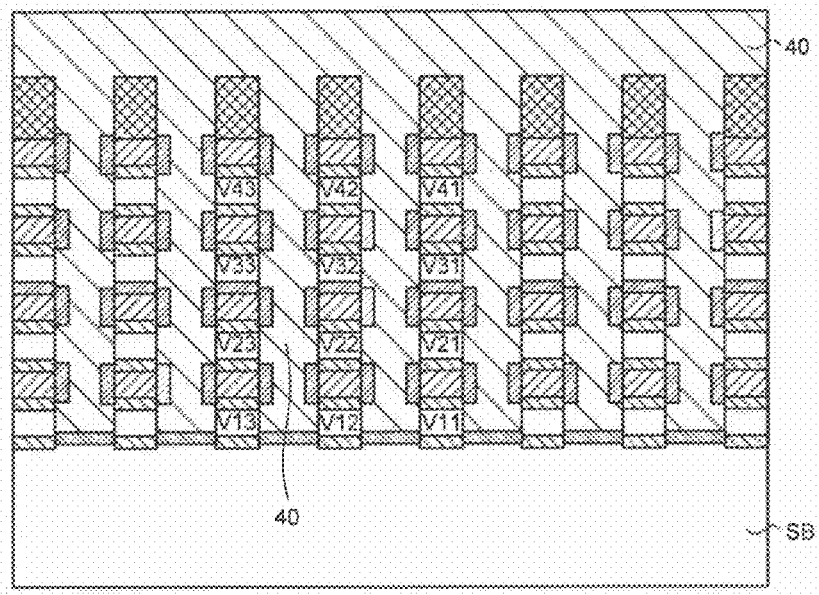

A configuration of a nonvolatile semiconductor storage device 1 according to the first embodiment is explained with reference to FIG. 1A to FIG. 2B. FIG. 1A is a perspective view illustrating the configuration of the nonvolatile semiconductor storage device 1. FIG. 1B is a diagram illustrating an equivalent circuit in the nonvolatile semiconductor storage device 1. FIG. 2A is a diagram illustrating a cross section that includes a word line in the nonvolatile semiconductor storage device 1. FIG. 2B is a diagram illustrating a cross section that does not include the word line in the nonvolatile semiconductor storage device 1. It should be noted that, although FIGS. 2A and 2B illustrate a four-layer semiconductor film, the semiconductor films of the third and the fourth layers are omitted in FIG. 1A for simplicity. In the followings, although three columns of the semiconductor films shown in FIG. 1A and the cross-sectional views of FIGS. 2A and 2B are mainly explained, the configurations arrayed repeatedly on right and left sides in FIGS. 2A and 2B are similar.

The nonvolatile semiconductor storage device 1 includes a semiconductor substrate SB, a plurality of semiconductor films (a plurality of second semiconductor films) 12a-1 to 12d-3 (see FIG. 2A), a plurality of gate dielectric films 31-11 to 32-32, a plurality of pillar members 21-1 to 22-4, a plurality of word lines WL1 and WL2, and an inter-layer dielectric film 40 (see FIG. 2B).

The semiconductor substrate SB is, for example, formed of silicon.

The semiconductor films 12a-1 to 12d-3 are stacked on the semiconductor substrate SB while being spaced from each other in a direction vertical to a surface SBa of the semiconductor substrate SB. The stacked semiconductor films 12a-1, 12b-1, 12c-1, and 12d-1 (arranged in the direction vertical to the surface SBa of the semiconductor substrate SB) are each sandwiched by the pillar members 21-1 and 21-2 on both side surfaces. Other stacked semiconductor films are similar to the stacked semiconductor films 12a-1, 12b-1, 12c-1, and 12d-1. Each of the semiconductor films 12a-1 to 12d-3 is formed of a material whose main component is silicon and is, for example, formed of single-crystal silicon.

Specifically, the semiconductor films 12a-1, 12a-2, and 12a-3 of the first layer are arranged at positions spaced by an interval D (see FIG. 2A) in the vertical direction from the surface SBa of the semiconductor substrate SB. The semiconductor films 12a-1, 12a-2, and 12a-3 of the first layer extend along (for example, parallel to) the surface SBa of the semiconductor substrate SB and are arranged side by side with each other (for example, parallel to each other). The semiconductor films 12a-1, 12a-2, and 12a-3 of the first layer, for example, have an approximately rectangular parallelepiped shape.

The semiconductor films 12b-1, 12b-2, and 12b-3 of the second layer are arranged at positions spaced by the interval D (see FIG. 2A) in the vertical direction from the semiconductor films 12a-1, 12a-2, and 12a-3 of the first layer, respectively. The semiconductor films 12b-1, 12b-2, and 12b-3 of the second layer extend along (for example, parallel to) the surface SBa of the semiconductor substrate SB and are arranged side by side with each other (for example, parallel to each other). The semiconductor films 12b-1, 12b-2, and 12b-3 of the second layer, for example, have an approximately rectangular parallelepiped shape. The semiconductor films 12c-1, 12c-2, and 12c-3 of the third layer are similar to the semiconductor films 12b-1, 12b-2, and 12b-3 of the second layer.

The upper surfaces of the semiconductor films 12d-1, 12d-2, and 12d-3 of the fourth layer are covered with silicon nitride films 13-1, 13-2, and 13-3, respectively. In other points, the semiconductor films 12d-1, 12d-2, and 12d-3 of the fourth layer are similar to the semiconductor films 12b-1, 12b-2, and 12b-3 of the second layer. As structurally shown in FIG. 1A, it is applicable to have a configuration in which the silicon nitride films 13-1, 13-2, and 13-3 and the uppermost semiconductor films 12d-1, 12d-2, and 12d-3 are formed with a predetermined interval therebetween.

Each of the semiconductor films 12a-1 to 12d-3 functions as an active region. In other words, in each of the semiconductor films 12a-1 to 12d-3, portions that intersect with the pillar members 21-1 to 22-4 become channel regions of the transistors and portions adjacent to both sides of these portions become source regions or drain regions of the transistors.

For example, portions of the semiconductor film 12a-1 that intersect with the pillar members 21-1 and 22-1 become the channel regions of transistors M1 and M2 (see FIG. 1B), respectively. For example, in the semiconductor film 12a-1, if the transistors M1 and M2 are NMOS transistors (PMOS transistors), a portion adjacent to the intersecting portion on the source line side becomes the source region (drain region) and a portion adjacent to the intersecting portion on the bit line side becomes the drain region (source region). The semiconductor film 12a-1 is connected to a source line (not shown) at one end in a longitudinal direction and is connected to a bit line (not shown) at the other end.

In the similar manner, for example, portions of the semiconductor film 12b-1 that intersect with the pillar members 21-1 and 22-1 become the channel regions of transistors M3 and M4 (see FIG. 1B), respectively. For example, in the semiconductor film 12b-1, if the transistors M3 and M4 are NMOS transistors (PMOS transistors), a portion adjacent to the intersecting portion on the source line side becomes the source region (drain region) and a portion adjacent to the intersecting portion on the bit line side becomes the drain region (source region). The semiconductor film 12b-1 is connected to the source line (not shown) at one end in the longitudinal direction and is connected to the bit line (not shown) at the other end.

Each of the gate dielectric films 31-11 to 32-32 extends in a direction vertical to the surface SBa of the semiconductor substrate SB. The gate dielectric films 31-11 to 32-32 are arranged on the side surfaces of the semiconductor films 12a-1 to 12d-3. For example, the gate dielectric film 31-11 is arranged on the side surfaces of the stacked semiconductor films 12a-1, 12b-1, 12c-1, and 12d-1 (see FIG. 2A). Other gate dielectric films 31-12 to 32-32 are similar to the gate dielectric film 31-11.

Each of the gate dielectric films 31-11 to 32-32 includes a charge trapping film having a charge retention. Each of the gate dielectric films 31-11 to 32-32 is, for example, formed of an ONO film. The ONO film has a three-stacked-layer structure in which two silicon oxide films sandwich a silicon nitride film. Each of the gate dielectric films 31-11 to 32-32 includes the silicon nitride film in the ONO film as the charge trapping film and can trap charges in the silicon nitride film.

In the gate dielectric film 31-11, the charge trapping film (silicon nitride film) in portions 310-1, 31ab-1, and 31bc-1 that do not intersect with the semiconductor films 12a-1 and 12b-1 is formed of a material (composition) that contains more oxygen than the charge trapping film (silicon nitride film) in portions 31a-1 and 31b-1 that intersect with the semiconductor films 12a-1 and 12b-1. Whereby, in the gate dielectric film 31-11, the dielectric constant of the portions 310-1, 31ab-1, and 31bc-1 that do not intersect with the semiconductor films 12a-1 and 12b-1 is lower than the dielectric constant of the portions 31a-1 and 31b-1 that intersect with the semiconductor films 12a-1 and 12b-1. In other words, in the gate dielectric film 31-11, the charge retention of the portions 310-1, 31ab-1, and 31bc-1 that do not intersect with the semiconductor films 12a-1 and 12b-1 is lower than the charge retention of the portions 31a-1 and 31b-1 that intersect with the semiconductor films 12a-1 and 12b-1. Other gate dielectric films 31-12 to 32-32 are similar to the gate dielectric film 31-11.

Each of the pillar members 21-1 to 22-4 extends in a direction vertical to the surface SBa of the semiconductor substrate SB. The pillar members 21-1 to 22-4 hold the semiconductor films 12*a*-1 to 12*d*-3 via the gate dielectric films 31-11 to 32-32. For example, the pillar member 21-1 holds the stacked semiconductor films 12*a*-1, 12*b*-1, 12*c*-1, and 12*d*-1 (see FIG. 2A) via the gate dielectric film 31-11. Other pillar members 21-2 to 22-4 are similar to the pillar member 21-1. Each of the pillar members 21-1 to 22-4 is formed of a semiconductor (for example, material whose main component is silicon). Each of the pillar members 21-1 to 22-4 is, for example, formed of polysilicon. Each of the pillar members 21-1 to 22-4 can be also formed of a conductor (for example, material whose main component is tungsten). Each of the pillar members 21-1 to 22-4 can be also formed of, for example, tungsten silicide.

Each of the pillar members 21-1 to 22-4 functions as a control gate of a transistor. For example, portions of the pillar member 21-1 that face (intersect with) the semiconductor films 12*a*-1 and 12*b*-1 become the control gates of the transistors M1 and M3, respectively. For example, portions of the pillar member 22-1 that face the semiconductor films 12*a*-1 and 12*b*-1 become the control gates of the transistors M2 and M4, respectively.

Each of the word lines WL1 and WL2 extends in a direction that intersects with the longitudinal direction of each of the semiconductor films 12*a*-1 to 12*d*-3 along (for example, parallel to) the surface SBa of the semiconductor substrate SB. The word line WL1 connects the pillar members 21-1 to 21-4 that are arranged in a line along the surface SBa of the semiconductor substrate SB. The word line WL2 connects the pillar members 22-1 to 22-4 that are arranged in a line along the surface SBa of the semiconductor substrate SB. The word line WL1 is formed of a conductive material, and for example, has a two-stacked-layer structure in which a polysilicon layer WL1*b* and a nickel silicon layer WL1*a* are stacked in order. The word line WL2 is similar to the word line WL1.

The inter-layer dielectric film 40 is embedded around the semiconductor films 12*a*-1 to 12*d*-3, the pillar members 21-1 to 22-4, and the word lines WL1 and WL2 (see FIG. 2B) on the semiconductor substrate SB. Moreover, the inter-layer dielectric film 40 includes voids V21 to V43 in respective regions between the semiconductor films 12*a*-1 to 12*d*-3. Furthermore, the inter-layer dielectric film 40 includes voids V11 to V13 in regions between the semiconductor substrate SB and the semiconductor film 12*a*-1 to 12*a*-3 of the first layer. The inter-layer dielectric film 40 is, for example, formed of silicon oxide. Each of the voids V11 to V43, for example, has an approximately rectangular parallelepiped shape.

In this manner, the nonvolatile semiconductor storage device 1 has a configuration in which transistors are three-dimensionally arranged.

A case is assumed where the inter-layer dielectric film 40 does not include the voids V21 to V43 in respective regions between the semiconductor films 12*a*-1 to 12*d*-3. In this case, in the three-dimensional array of the memory cells (transistors) of the nonvolatile semiconductor storage device 1, if the interval between the transistors adjacent in the vertical direction is made small to improve the arrangement density of the memory cells (transistors), the coupling capacitance between the transistors adjacent in the vertical direction cannot be ignored. For example, in the configuration shown in FIG. 1B, if the interval between the transistor M1 and the transistor M3 that are adjacent in the vertical direction becomes small, a coupling capacitance C13 between the semiconductor film (active region) 12*a*-1 and the semiconductor film (active region) 12*b*-1 that are stacked becomes large to a level that cannot be ignored. Consequently, the potential (potential of the back gate, the source region, the drain region, the channel region, and the like) of the active region of each of the transistors M1 and M3 becomes unstable due to the coupling capacitance between the transistor M1 and the transistor M3 that are adjacent in the vertical direction, so that each of the transistors M1 and M3 may malfunction.

On the contrary, in the first embodiment, the inter-layer dielectric film 40 includes the voids V21 to V43 in respective regions between the semiconductor films 12*a*-1 to 12*d*-3. Whereby, even when the interval between the transistors adjacent in the vertical direction is made small, the coupling capacitance between the transistors adjacent in the vertical direction can be easily reduced to a level that can be ignored. For example, in the configuration shown in FIG. 1B, even if the interval between the transistor M1 and the transistor M3 that are adjacent in the vertical direction becomes small, the void V21 (see FIG. 2A) is formed between the semiconductor film (active region) 12*a*-1 and the semiconductor film (active region) 12*b*-1 that are stacked, so that the coupling capacitance C13 between the semiconductor film (active region) 12*a*-1 and the semiconductor film (active region) 12*b*-1 can be easily reduced to a level that can be ignored. In other words, according to the first embodiment, in the configuration in which the transistors are three-dimensionally arranged, when the interval between the transistors adjacent in the vertical direction is made small, malfunction of the transistor due to the coupling capacitance can be reduced.

Alternatively, a case is assumed where the inter-layer dielectric film 40 does not include the voids V21 to V43 in the respective regions between the semiconductor films 12*a*-1 to 12*d*-3 and the interval between the transistors adjacent in the vertical direction is made large to reduce the coupling capacitance between the transistors adjacent in the vertical direction. In this case, it becomes difficult to improve the arrangement density of the memory cells (transistors). In other words, if the inter-layer dielectric film 40 between the stacked polysilicon (active regions) is formed thick, the number of the memory cells (transistors) that can be arranged in the vertical direction decreases.

On the contrary, in the first embodiment, the void V21 (see FIG. 2A) is formed between the semiconductor film (active region) 12*a*-1 and the semiconductor film (active region) 12*b*-1 that are stacked, so that the coupling capacitance between the transistors adjacent in the vertical direction can be reduced without making the interval between the transistors adjacent in the vertical direction large and the arrangement density of the memory cells (transistors) can be easily improved.

Alternatively, a case is assumed where, in the gate dielectric film 31-11, the dielectric constant (charge retention) is uniformly distributed. In this case, if the interval between the transistors adjacent in the vertical direction is made small, charges may move between the transistors adjacent in the vertical direction. For example, if the dielectric constant (charge retention) of the portions 31*a*-1, 31*ab*-1, and 31*b*-1 in the gate dielectric film 31-11 is approximately equal, charges trapped in the portion 31*a*-1 in the gate dielectric film 31-11 can easily move to the portion 31*b*-1 via the portion 31*ab*-1. Alternatively, charges trapped in the portion 31*b*-1 in the gate dielectric film 31-11 can easily move to the portion 31*a*-1 via the portion 31*ab*-1. In other words, in the configuration shown in FIG. 1B, if the interval between the transistor M1 and the transistor M3 that are adjacent in the vertical direction becomes small, charges may easily move between the transistor M1 and the transistor M3 as indicated by a one-dot chain line arrow. Therefore, in the configuration in which the transistors are three-dimensionally arranged, when the interval between the transistors adjacent in the vertical direction is made small, each of the transistors M1 and M3 may malfunction due to the movement of charges (leak current).

On the contrary, in the first embodiment, in the gate dielectric film 31-11, the dielectric constant (charge retention) of the portions 310-1, 31ab-1, and 31bc-1 that do not intersect with the semiconductor films 12a-1 and 12b-1 is lower than the dielectric constant (charge retention) of the portions 31a-1 and 31b-1 that intersect with the semiconductor films 12a-1 and 12b-1. Whereby, even when the interval between the transistors adjacent in the vertical direction is made small, charges do not easily move between the transistors adjacent in the vertical direction. Consequently, in the configuration in which the transistors are three-dimensionally arranged, when the interval between the transistors adjacent in the vertical direction is made small, malfunction of the transistor due to the movement of charges (leak current) can be reduced.

A manufacturing method of the nonvolatile semiconductor storage device 1 according to the first embodiment is explained with reference to FIG. 3A to FIG. 10D. The perspective views shown in FIG. 3A to FIG. 9A correspond to the perspective view of FIG. 1A. The cross-sectional views shown in FIG. 3B to FIG. 9B, FIG. 6D, and FIGS. 10A and 10C correspond to the cross-sectional view of FIG. 2A. The cross-sectional views shown in FIG. 3B to FIG. 9B, FIG. 6D, and FIGS. 10A and 10C illustrate cross sections cut along one-dot chain lines in the plan views of FIG. 3C to FIG. 9C, FIG. 6E, and FIGS. 10B and 10D, respectively.

Figure 3A:
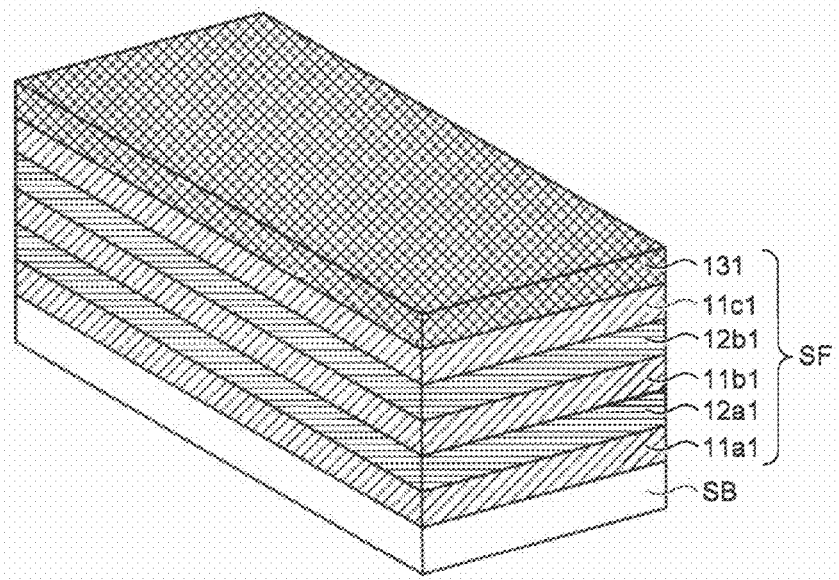
FIG. 3A to FIG. 3C are diagrams illustrating a manufacturing method of the nonvolatile semiconductor storage device according to the first embodiment.
Figure 3B:
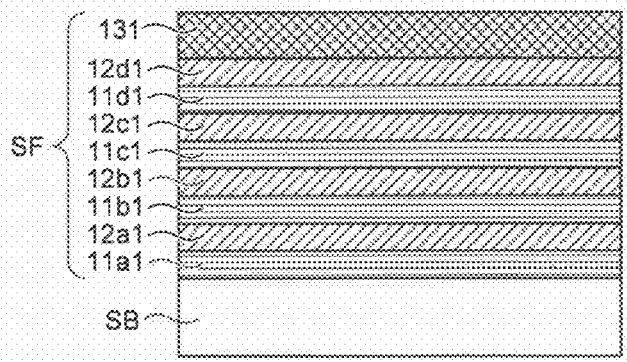
Figure 3C:
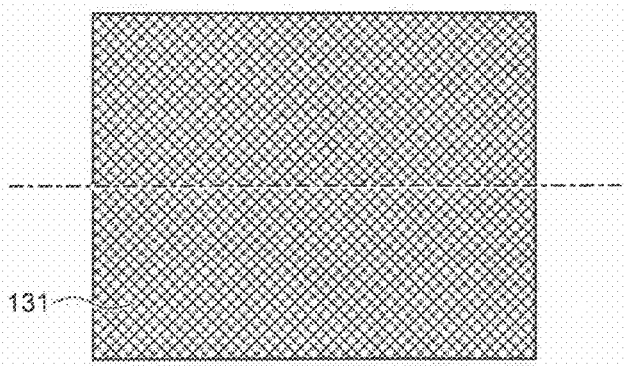

In the processes shown in FIGS. 3A to 3C, a stacked film (stacked structure) SF, in which a first semiconductor film (first semiconductor layer) and a second semiconductor film (second semiconductor layer) are stacked alternately a plurality of times, is formed on the semiconductor substrate SB. Specifically, a first semiconductor film 11a1 is deposited on the semiconductor substrate SB. The first semiconductor film 11a1 is formed of a material whose main component is silicon germanium. The first semiconductor film 11a1 is, for example, formed of single-crystal silicon germanium by using an epitaxial growth technique. A second semiconductor film 12a1 is deposited on the first semiconductor film 11a1. The second semiconductor film 12a1 is formed of a material whose main component is silicon. The second semiconductor film 12a1 is, for example, formed of single-crystal silicon by using the epitaxial growth technique. The first semiconductor film 11a1 to a second semiconductor film 12d1 are stacked in order on the semiconductor substrate SB by repeating the similar processes. Then, a silicon nitride film 131 is deposited on the second semiconductor film 12d1. Whereby, the stacked film SF, in which the first semiconductor film 11a1, the second semiconductor film 12a1, a first semiconductor film 11b1, a second semiconductor film 12b1, a first semiconductor film 11c1, a second semiconductor film 12c1, a first semiconductor film 11d1, the second semiconductor film 12d1, and the silicon nitride film 131 are stacked in order, can be obtained.

FIG. 3B illustrates a case as an example in which the stacked film SF includes the second semiconductor films 12a1 to 12d1 with four layers, and no major difference occurs in the manufacturing method even if the stacked film SF includes the second semiconductor films with more layers.

Figure 4A:
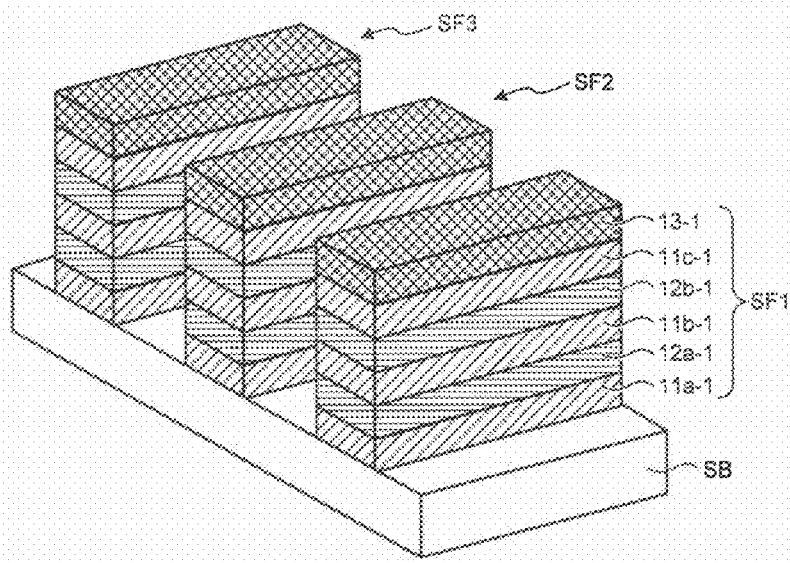
FIG. 4A to FIG. 4C are diagrams illustrating the manufacturing method of the nonvolatile semiconductor storage device according to the first embodiment.
Figure 4B:
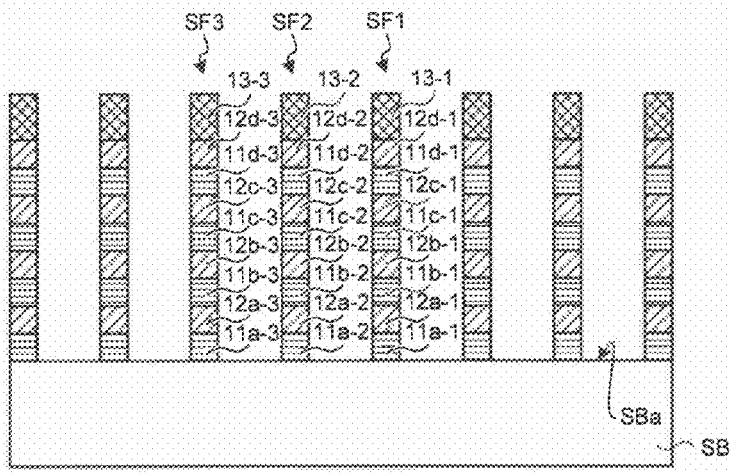
Figure 4C:
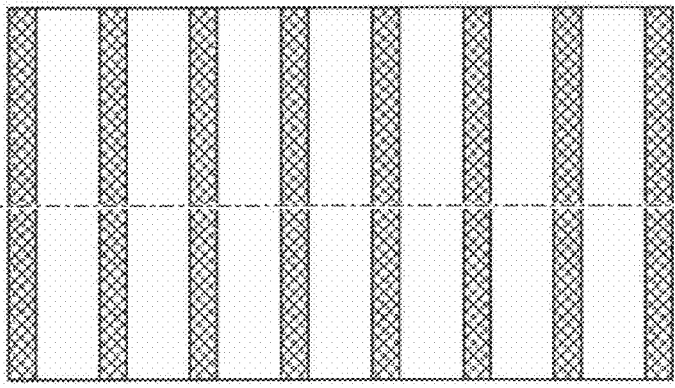

In the processes shown in FIGS. 4A to 4C, a first resist pattern (not shown) including a plurality of first line patterns arranged side by side with each other (for example, parallel to each other) is formed on the stacked film SF by a photolithography process. Then, the stacked film SF is subjected to an etching process by a dry etching (for example, RIE) or the like with the first resist pattern as a mask so that the stacked film (stacked structure) SF is divided into a plurality of stacked films SF1 to SF3. Whereby, the stacked films SF1 to SF3 are formed. Thereafter, the first resist pattern is removed.

Each of the stacked films SF1 to SF3 has a fin shape that projects in a direction vertical to the surface SBa of the semiconductor substrate SB and that extends in a direction along the surface SBa of the semiconductor substrate SB. In the stacked film SF1, the first semiconductor film and the second semiconductor film are stacked alternately a plurality of times. In other words, in the stacked film SF1, a first semiconductor film 11a-1, the second semiconductor film 12a-1, a first semiconductor film 11b-1, the second semiconductor film 12b-1, a first semiconductor film 11c-1, the second semiconductor film 12c-1, a first semiconductor film 11d-1, the second semiconductor film 12d-1, and the silicon nitride film 13-1 are stacked in order. Other stacked films SF2 and SF3 are similar to the stacked film SF1.

Figure 5A:
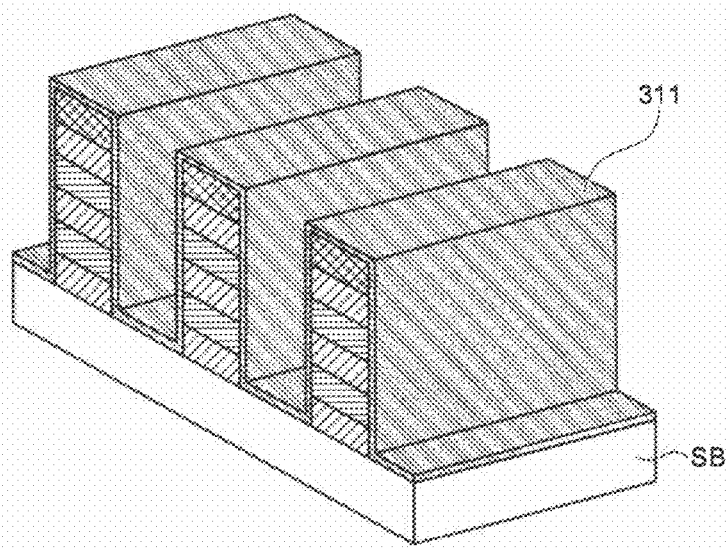
FIG. 5A to FIG. 5C are diagrams illustrating the manufacturing method of the nonvolatile semiconductor storage device according to the first embodiment.
Figure 5B:
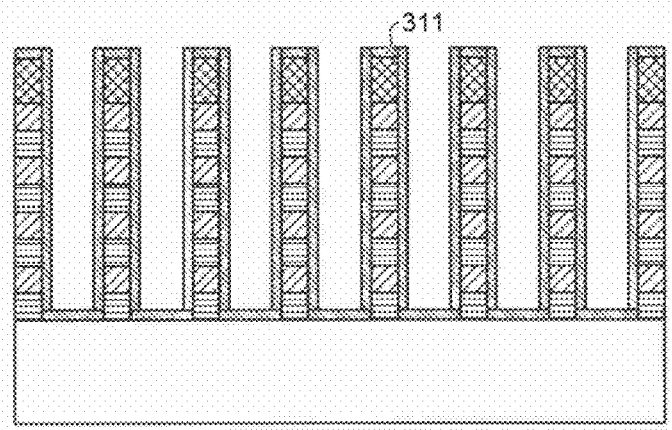
Figure 5C:
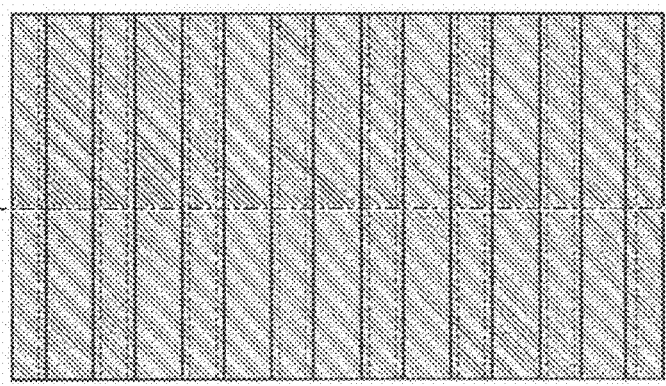

In the processes shown in FIGS. 5A to 5C, a gate dielectric film 311 is formed to cover the semiconductor substrate SB and the stacked films SF1 to SF3. The gate dielectric film 311 is, for example, formed of an ONO film. Specifically, a silicon oxide film, a silicon nitride film, and a silicon oxide film are deposited in order on the whole surface. Whereby, the gate dielectric film 311 is formed that has a three-stacked-layer structure in which two silicon oxide films sandwich the silicon nitride film.

Figure 6A:
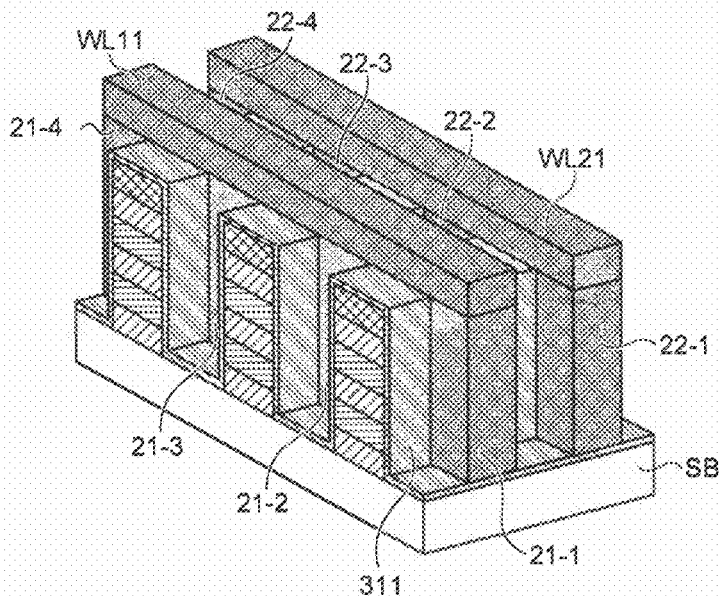
FIG. 6A to FIG. 6E are diagrams illustrating the manufacturing method of the nonvolatile semiconductor storage device according to the first embodiment.
Figure 6B:
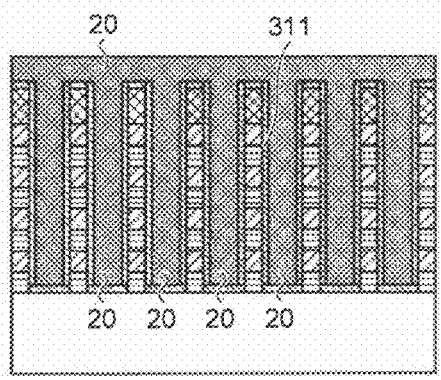
Figure 6C:
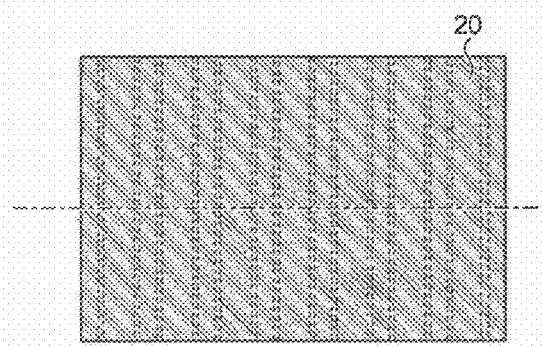
Figure 6D:
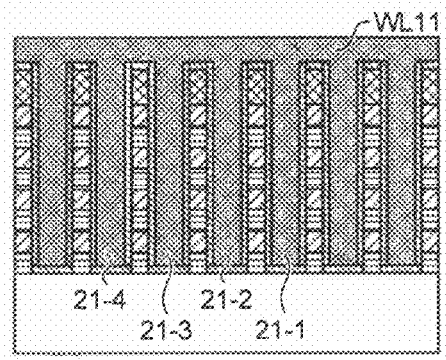
Figure 6E:
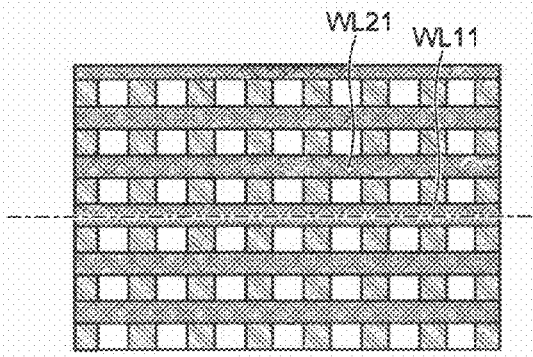

In the processes shown in FIGS. 6A to 6E, a predetermined film is embedded to cover the gate dielectric film 311 and the upper surface thereof is flattened by a CMP method or the like to form a film 20 (see FIGS. 6B and 6C). The film 20 is formed of a semiconductor (for example, material whose main component is silicon). The film 20 is, for example, formed of polysilicon. The film 20 can be also formed of a conductor (for example, material whose main component is tungsten). The film 20 can be also formed of, for example, tungsten silicide.

Then, a second resist pattern (not shown) including a plurality of second line patterns that is arranged side by side with each other (for example, parallel to each other) and extends in a direction that intersects with the stacked films SF1 to SF3 is formed on the film 20 by the photolithography process. Then, the film 20 is subjected to the etching process (patterning) by the dry etching (for example, RIE) or the like with the second resist pattern as a mask. Whereby, the pillar members 21-1 to 22-4 and a plurality of word lines WL11 and WL21 are formed (see FIGS. 6D and 6E).

Figure 7A:
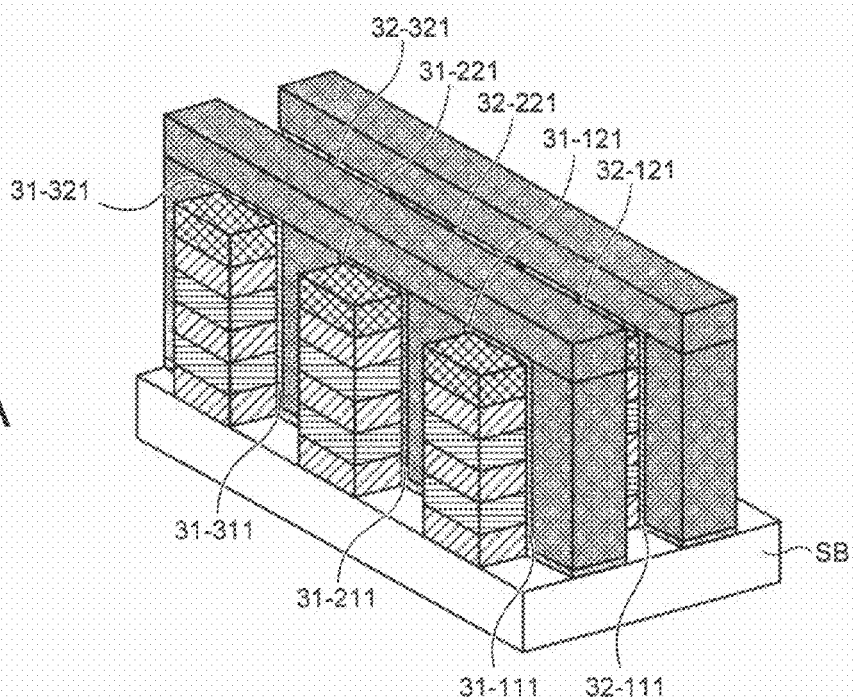
FIG. 7A to FIG. 7C are diagrams illustrating the manufacturing method of the nonvolatile semiconductor storage device according to the first embodiment.
Figure 7B:
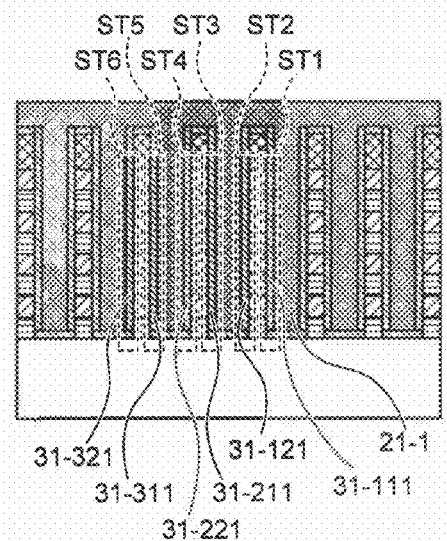
Figure 7C:
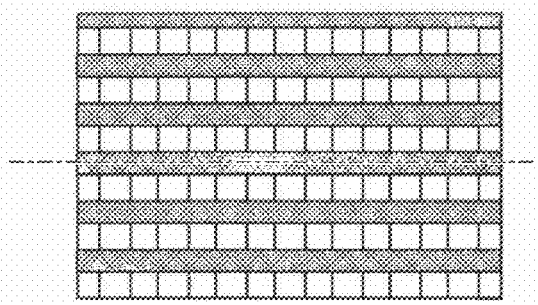

In the processes shown in FIGS. 7A to 7C, a portion in the gate dielectric film 311 that is not covered by the pillar members 21-1 to 22-4 and the word lines WL11 and WL21 is selectively removed. In other words, the gate dielectric film 311 is subjected to the etching process by the dry etching (for example, RIE) and/or a wet etching with the word lines WL11 and WL21 as a mask. Whereby, a plurality of gate dielectric films 31-111 to 32-321 is formed.

Thereafter, impurities are implanted into the side surfaces of the first semiconductor films 11a-1 to 11d-3 and the side surfaces of the second semiconductor films 12a-1 to 12d-3 in the stacked films SF1 to SF3, which are exposed, by a vapor-phase diffusion method, an ion implantation method, or the like to form source regions and drain regions (not shown), and a heat treatment for activation is performed.

In this manner, in the processes (forming process) shown in FIG. 3A to FIG. 7C, a plurality of structures ST1 to ST6 (see FIG. 7B) is formed in which at least the second semiconductor films 12a-1 to 12d-3 in the stacked films SF1 to SF3 are held by the pillar members 21-1 to 22-4 via the gate dielectric films 31-111 to 32-321. For example, in the structure ST1, the first semiconductor films 11a-1 to 11d-1 and the second semiconductor films 12a-1 to 12d-1 (see FIG. 4B) in the stacked film SF1 are held by the pillar member 21-1 via the gate dielectric film 31-111. Other structures ST2 to ST6 are similar to the structure ST1.

Figure 8A:
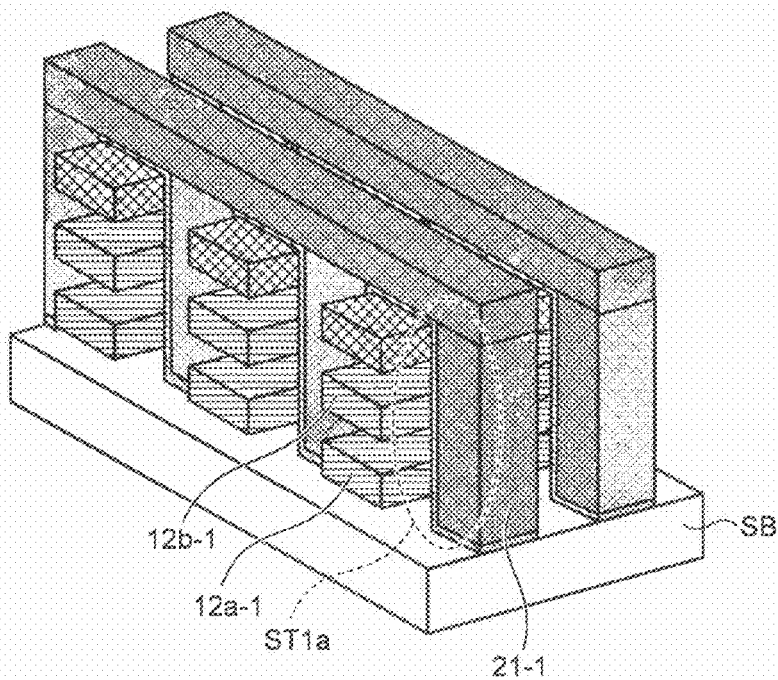
FIG. 8A to FIG. 8C are diagrams illustrating the manufacturing method of the nonvolatile semiconductor storage device according to the first embodiment.
Figure 8B:
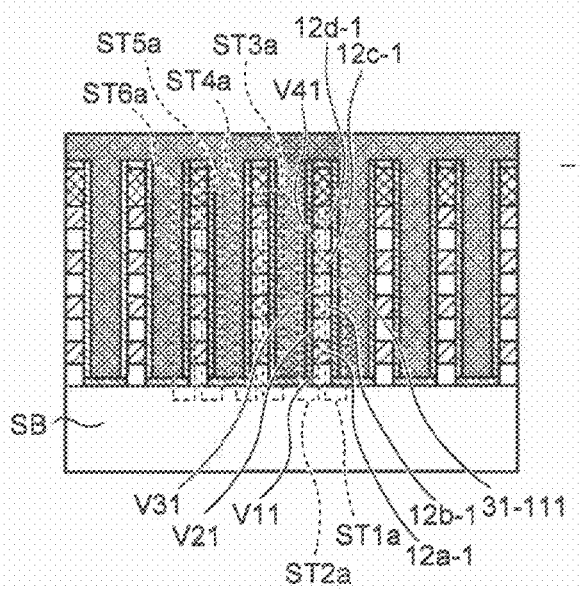
Figure 8C:
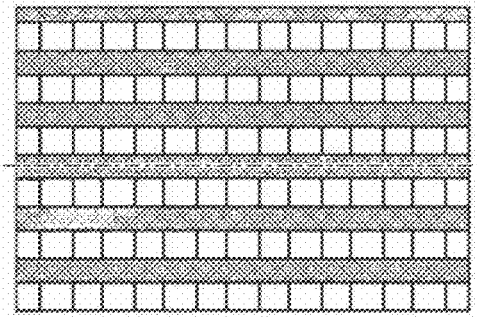

In the processes (removing process) shown in FIGS. 8A to 8C, in the structures ST1 to ST6 (see FIG. 7B), the first semiconductor films 11a-1 to 11d-3 are selectively removed from the stacked films SF1 to SF3 while maintaining the state where the second semiconductor films 12a-1 to 12d-3 are held by the pillar members 21-1 to 22-4. For example, in the structure ST1, the first semiconductor films 11a-1 to 11d-1 are selectively removed from the stacked film SF1 (see FIG. 4B) while maintaining the state where the second semiconductor films 12a-1 to 12d-1 are held by the pillar member 21-1.

Specifically, the first semiconductor films 11a-1 to 11d-3 (silicon germanium) are selectively etched and removed by at least one of the dry etching using a high-temperature HCl gas and the wet etching using acid such as SPM (sulfuric acid and hydrogen peroxide mixture treatment). At this time, a concentration of germanium included in the first semiconductor films 11a-1 to 11d-3 (silicon germanium) can be made equal to or larger than 30 at % for ensuring sufficiently large etching selectivity ratio of the first semiconductor films 11a-1 to 11d-3 (silicon germanium) with respect to the second semiconductor films 12a-1 to 12d-3 (silicon).

Whereby, a plurality of structures ST1a to ST6a having subjected to the removing process can be obtained. For example, in the structure ST1a having subjected to the removing process, the voids V21 to V41 are formed between the second semiconductor films 12a-1 to 12d-1. Moreover, in the structure ST1a having subjected to the removing process, the void V11 is formed between the lowermost second semiconductor film 12a-1 and the semiconductor substrate SB.

Figure 9A:
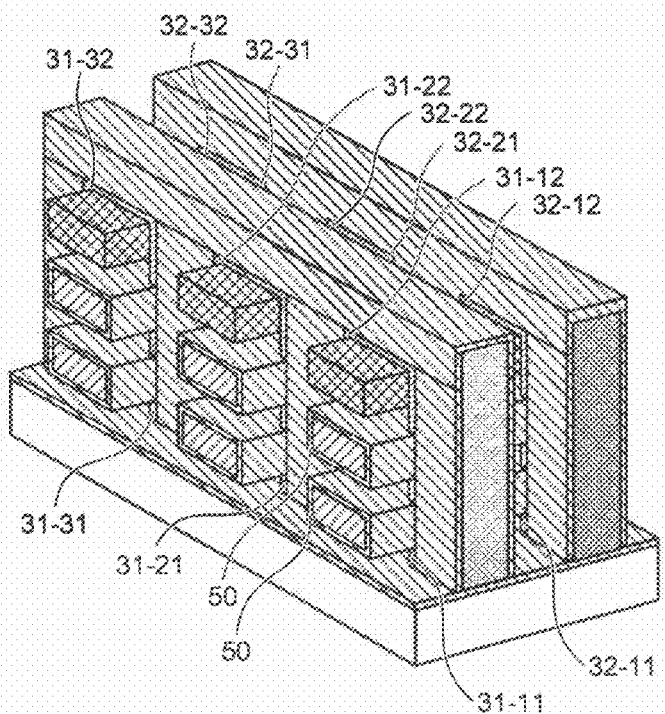
FIG. 9A to FIG. 9C are diagrams illustrating the manufacturing method of the nonvolatile semiconductor storage device according to the first embodiment.
Figure 9B:
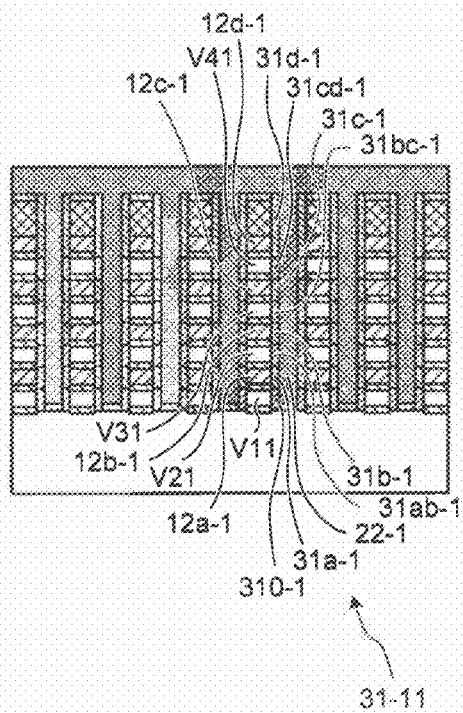
Figure 9C:
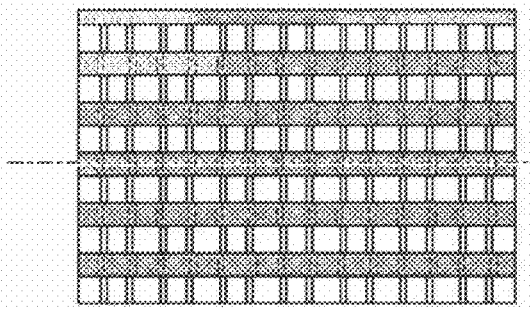

In the processes (oxidation process) shown in FIGS. 9A to 9C, in the structures ST1a to ST6a (see FIG. 8B) having subjected to the removing process, the exposed surfaces are oxidized by a thermal oxidation method or the like. For example, in the structure ST1a subjected to the removing process, the exposed upper surfaces and lower surfaces in the second semiconductor film 12a-1 to 12c-1 and the exposed lower surface in the second semiconductor film 12d-1 are oxidized. Whereby, an oxide film (thermal oxide film) 50 that covers the exposed surfaces of the second semiconductor films 12a-1 to 12d-1 is formed.

Moreover, the exposed surface in the gate dielectric film 31-111 is oxidized. In the gate dielectric film (ONO film) 31-111, a region that was in contact with the first semiconductor films (silicon germanium) 11a-1 to 11d-1 is directly subjected to the thermal oxidation treatment, so that transformation of the silicon nitride film in the ONO film toward a silicon oxide film proceeds (i.e., oxygen content of the silicon nitride film is increased), and the dielectric constant (charge retention) of the silicon nitride film can be lowered. In other words, the gate dielectric film 31-11 is formed such that the charge trapping film (silicon nitride film) in the portions 310-1, 31ab-1, 31bc-1, and 31cd-1 that do not intersect with the second semiconductor films 12a-1 to 12d-1 is formed of a material (composition) that contains more oxygen than the charge trapping film (silicon nitride film) in the portions 31a-1, 31b-1, 31c-1, and 31d-1 that intersect with the second semiconductor films 12a-1 to 12d-1. Whereby, in the obtained gate dielectric film 31-11, the dielectric constant (charge retention) of the portions 310-1, 31ab-1, 31bc-1, and 31cd-1 that do not intersect with the second semiconductor films 12a-1 to 12d-1 is lower than the dielectric constant (charge retention) of the portions 31a-1, 31b-1, 31c-1, and 31d-1 that intersect with the second semiconductor films 12a-1 to 12d-1. Other gate dielectric films 31-12 to 32-32 are similar to the gate dielectric film 31-11.

Figure 10A:
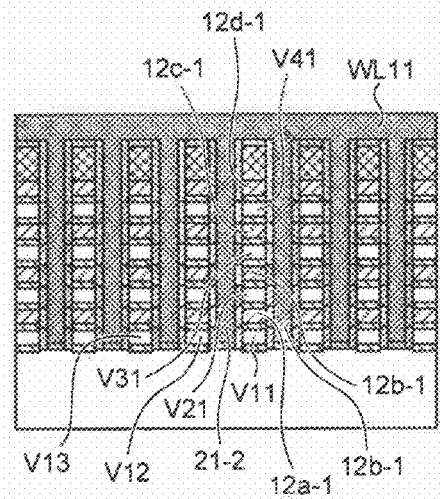
FIG. 10A to FIG. 10D are diagrams illustrating the manufacturing method of the nonvolatile semiconductor storage device according to the first embodiment.
Figure 10B:
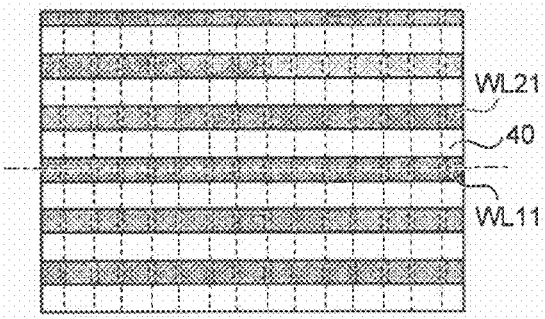

In the processes (embedding process) shown in FIGS. 10A and 10B, the inter-layer dielectric film 40 is embedded such that the voids V21 to V43 are left between the second semiconductor films 12a-1 to 12d-3 in the structures ST1a to ST6a (see FIG. 8B) having subjected to the removing process. Specifically, the inter-layer dielectric film 40 is embedded in a region sandwiched by the word lines WL11 and WL21 when viewed from a direction vertical to the surface SBa of the semiconductor substrate SB by a plasma CVD process or the like in which a step coverage is relatively low. For example, a dielectric film is embedded in a region (see FIG. 10B) sandwiched between the word line WL11 and the word line WL21 and the upper surface of the embedded dielectric film is flattened by the CMP method or the like to form the inter-layer dielectric film 40. With such processes, the voids V21 to V43 are left in the regions surrounded by the pillar members 21-1 to 22-4 and the second semiconductor films 12a-1 to 12d-3. For example, the voids V21 to V41 are left in the regions surrounded by the pillar members 21-1 and 21-2 and the second semiconductor films 12a-1 to 12d-1. Moreover, the voids V11, V12, and V13 are left between the lowermost second semiconductor films 12a-1, 12a-2, and 12a-3 and the semiconductor substrate SB. Whereby, the inter-layer dielectric film 40 is formed to be embedded in the region around the semiconductor films 12a-1 to 12d-3, the pillar members 21-1 to 22-4, and the word lines WL11 and WL21 (see FIG. 2B) on the semiconductor substrate SB. The inter-layer dielectric film 40 is, for example, formed of silicon oxide.

Figure 10C:
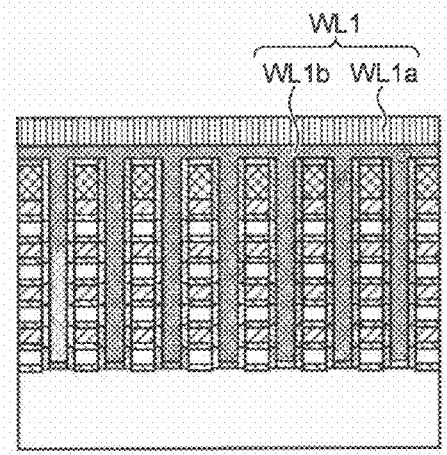
Figure 10D:
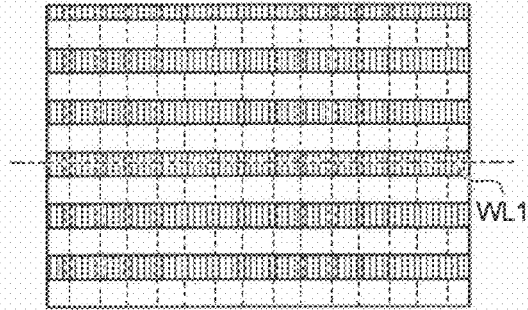

In the processes shown in FIGS. 10C and 10D, the upper portion of the word lines WL11 and WL12 is transformed into a metal silicide (for example, a nickel silicide) by a salicide process. Whereby, for example, the word line WL1 in which the polysilicon layer WL1b and the nickel silicon layer WL1a are stacked in order is formed.

A case is assumed where, in the processes shown in FIGS. 4A to 4C, a member that holds any of the side surfaces of the stacked films SF1 to SF3 is formed, and the first semiconductor films 11a-1 to 11d-3 are selectively removed from the stacked films SF1 to SF3 while maintaining the state of holding the side surface by the member. For example, in the case of removing the first semiconductor films 11a-1 to 11d-1 from the stacked film SF1, the gate dielectric film 311 may be deposited in the processes shown in FIGS. 5A to 5C in the voids V21 to V41 formed between the second semiconductor films 12a-1 to 12d-1 and the film 20 may be deposited in the voids V21 to V41 in the processes shown in FIGS. 6A to 6E. Therefore, the voids V21 to V41 are filled with the gate dielectric film 311 and the film 20, so that it becomes difficult to keep the voids V21 to V41 left.

On the contrary, in the first embodiment, the first semiconductor films 11a-1 to 11d-3 are not removed in the processes shown in FIGS. 4A to 4C, and the first semiconductor films 11a-1 to 11d-3 are removed in the processes shown in FIGS. 8A to 8C that are processes after forming the pillar members 21-1 to 22-4 and the word lines WL11 and WL21. Then, in the processes shown in FIGS. 10A and 10B, the inter-layer dielectric film 40 is embedded such that the voids V21 to V43 are left between the second semiconductor films 12a-1 to 12d-3 in the structures ST1a to ST6a (see FIG. 8B) having subjected to the removing process. Whereby, the nonvolatile semiconductor storage device 1 in which the transistors are three-dimensionally arranged and the inter-layer dielectric film 40 includes the voids V21 to V43 in the respective regions between the second semiconductor films (active regions) 12a-1 to 12d-3 can be manufactured.

In this case, even if the nonvolatile semiconductor storage device is formed such that the interval between the transistors adjacent in the vertical direction is made small, the coupling capacitance between the transistors adjacent in the vertical direction can be easily reduced to a level that can be ignored. For example, in the configuration shown in FIG. 1B, even if the interval between the transistor M1 and the transistor M3 that are adjacent in the vertical direction becomes small, the void V21 (see FIG. 2A) is formed between the semiconductor film (active region) 12a-1 and the semiconductor film (active region) 12b-1 that are stacked, so that the coupling capacitance C13 between the semiconductor film (active region) 12a-1 and the semiconductor film (active region) 12b-1 can be easily reduced to a level that can be ignored. In other words, according to the first embodiment, in the configuration in which the transistors are three-dimensionally arranged, when the interval between the transistors adjacent in the vertical direction is made small, malfunction of the transistor due to the coupling capacitance can be reduced.

A case is assumed where, in the processes shown in FIGS. 10A and 10B, the inter-layer dielectric film 40 is embedded such that the voids V21 to V43 between the second semiconductor films 12a-1 to 12d-3 in the structures ST1a to ST6a (see FIG. 8B) having subjected to the removing process are filled by a process in which the step coverage is relatively high. In this case, in order to fill the voids V21 to V43 sufficiently, even by the process with high step coverage, the intervals between the second semiconductor films 12a-1 to 12d-3 in a direction vertical to the surface SBa of the semiconductor substrate SB need to be made large enough to make the vertical widths of the voids V21 to V43 large. Moreover, in this case, the interval between the transistors adjacent in the vertical direction needs to be made large enough to reduce the coupling capacitance between the transistors adjacent in the vertical direction. Therefore, it becomes difficult to improve the arrangement density of the memory cells (transistors). In other words, if the inter-layer dielectric film 40 between the stacked polysilicon (active regions) is formed thick, the number of the memory cells (transistors) that can be arranged in the vertical direction decreases.

On the contrary, in the first embodiment, in the processes shown in FIGS. 10A and 10B, for example, the void V21 (see FIG. 2A) between the semiconductor film (active region) 12a-1 and the semiconductor film (active region) 12b-1 that are stacked is left without being filled. Whereby, the coupling capacitance between the transistors adjacent in the vertical direction can be reduced and the intervals between the second semiconductor films 12a-1 to 12d-3 in a direction vertical to the surface SBa of the semiconductor substrate SB do not need to be made large, so that the arrangement density of the memory cells (transistors) can be easily improved.

Alternatively, a case is assumed where each of the second semiconductor films (active regions) 12a-1 to 12d-3 is formed of polysilicon. In this case, a carrier mobility decreases, so that a parasitic resistance may increase and therefore writing/reading speed may decrease, thus, the number of stages of the memory cells (transistors) that can be controlled by one bit line may not be made large. Moreover, variation in transistor properties of the memory cells may become large depending on a position at which a crystal grain boundary of polysilicon is present (for example, a distribution of impurities and a way an electric field is applied to a channel change depending on presence or absence of the crystal grain boundary in a channel region of a transistor).

On the contrary, in the first embodiment, in the processes shown in FIGS. 3A to 3C, the stacked film SF, in which the first semiconductor films 11a1 to 11d1 and the second semiconductor films 12a1 to 12d1 are stacked alternately a plurality of times, is formed on the semiconductor substrate SB. In other words, the first semiconductor films 11a1 to 11d1 and the second semiconductor films 12a1 to 12d1 are each deposited in layers, so that they can be epitaxially grown easily as a single crystal. In other words, the second semiconductor films 12a1 to 12d1 can be formed of single-crystal silicon by using the epitaxial growth technique. Whereby, it is possible to suppress decreasing of the carrier mobility, and is also possible to reduce variation in the transistor properties of the memory cells that depends on the position at which the crystal grain boundary is present.

Alternatively, a case is assumed where the processes shown in FIGS. 10A and 10B are performed without performing the processes shown in FIGS. 9A to 9C. In this case, the dielectric constant (charge retention) in each of the gate dielectric films 31-11 to 32-32 becomes uniformly distributed, so that if the interval between the transistors adjacent in the vertical direction is made small, charges may easily move between the transistors adjacent in the vertical direction. For example, if the dielectric constant (charge retention) of the portions 31a-1, 31ab-1, and 31b-1 in the gate dielectric film 31-11 is approximately equal, charges trapped in the portion 31a-1 in the gate dielectric film 31-11 can easily move to the portion 31b-1 via the portion 31ab-1. Alternatively, charges trapped in the portion 31b-1 in the gate dielectric film 31-11 can easily move to the portion 31a-1 via the portion 31ab-1. In other words, in the configuration shown in FIG. 1B, if the interval between the transistor M1 and the transistor M3 that are adjacent in the vertical direction becomes small, charges may easily move between the transistor M1 and the transistor M3 as indicated by a one-dot chain line arrow. Therefore, in the configuration in which the transistors are three-dimensionally arranged, when the interval between the transistors adjacent in the vertical direction is made small, each of the transistors M1 and M3 may malfunction due to the movement of charges (leak current).

On the contrary, in the first embodiment, the processes shown in FIGS. 10A and 10B are performed after performing the processes shown in FIG. 9A to 9C. In other words, in the processes shown in FIGS. 9A to 9C, in the structures ST1a to ST6a (see FIG. 8B) having subjected to the removing process, the exposed surfaces in the gate dielectric films 31-111 to 32-321 are oxidized by the thermal oxidation method or the like such that the voids V21 to V43 are left between the second semiconductor films 12a-1 to 12d-3. For example, in the gate dielectric film (ONO film) 31-111, a region that was in contact with the first semiconductor films (silicon germanium) 11a-1 to 11d-1 is directly subjected to the thermal oxidation treatment, so that transformation of the silicon nitride film in the ONO film toward a silicon oxide film proceeds, and the dielectric constant (charge retention) of the silicon nitride film can be lowered. In other words, in the gate dielectric film 31-11 formed by the processes shown in FIGS. 9A to 9C, the dielectric constant (charge retention) of the portions 310-1, 31ab-1, and 31bc-1 that do not intersect with the semiconductor films 12a-1 and 12b-1 is lower than the dielectric constant (charge retention) of the portions 31a-1 and 31b-1 that intersect with the semiconductor films 12a-1 and 12b-1. Whereby, even when the interval between the transistors adjacent in the vertical direction is made small, charges do not easily move between the transistors adjacent in the vertical direction. Consequently, in the configuration in which the transistors are three-dimensionally arranged, when the interval between the transistors adjacent in the vertical direction is made small, malfunction of the transistor due to the movement of charges (leak current) can be reduced.

Alternatively, a case is assumed where, in the processes shown in FIGS. 3A to 3C, a stacked film, in which silicon oxide films and the second semiconductor films (films formed of a material whose main component is silicon) 12a1 to 12d1 are stacked alternately a plurality of times, is formed. In this case, in the processes shown in FIGS. 4A to 4C, it is needed to continuously process the materials, which are the silicon oxide films and the second semiconductor films 12a1 to 12d1, having largely different properties, so that the dry etching (RIE) needs to be performed while alternately switching etching gases. Therefore, the processing time of the etching process becomes long and it becomes difficult to process such that continuous vertical side surfaces are formed.

On the contrary, in the first embodiment, in the processes shown in FIGS. 3A to 3C, the stacked film SF, in which the first semiconductor films 11a1 to 11d1 and the second semiconductor films 12a1 to 12d1 are stacked alternately a plurality of times, is formed. The first semiconductor films 11a1 to 11d1 are formed of a material whose main component is silicon germanium. The second semiconductor films 12a1 to 12d1 are formed of a material whose main component is silicon. Whereby, in the processes shown in FIGS. 4A to 4C, materials with a similar substance system, which are silicon germanium and silicon, are processed continuously, so that the dry etching (RIE) can be continuously performed without switching etching gases. Whereby, the processing time of the etching process can be shortened and it becomes easily to process such that continuous vertical side surfaces are formed.

It should be noted that, in the nonvolatile semiconductor storage device 1, it is applicable to cause the semiconductor films (second semiconductor films) 12a-1 to 12d-3 to function as the control gates of the transistors and cause the pillar members 21-1 to 22-4 to function as the active regions. In this case, the pillar members 21-1 to 22-4 are connected by the bit line instead of by the word line. Moreover, each of the semiconductor films (each of the second semiconductor films) 12a-1 to 12d-3 is connected to the word line at one end in the longitudinal direction.

Moreover, in the processes shown in FIGS. 3A to 3C, the first semiconductor films 11a1 to 11d1 can be formed of, for example, a first single-crystal silicon germanium that includes germanium at a first concentration by using the epitaxial growth technique. In other words, it is applicable that the first semiconductor films 11a1 to 11d1 are formed of the first single-crystal silicon germanium as a material whose main component is silicon germanium. Furthermore, the second semiconductor films 12a1 to 12d1 can be formed of, for example, a second single-crystal silicon germanium that includes germanium at a second concentration lower than the first concentration by using the epitaxial growth technique. In other words, it is applicable that the second semiconductor films 12a1 to 12d1 are formed of the second single-crystal silicon germanium as a material whose main component is silicon.

The first concentration is, for example, 20 at % or more and 50 at % or less, and the second concentration is, for example, 10 at % or less. At this time, the difference between the first concentration and the second concentration can be set to 30 at % or more for ensuring sufficiently large etching selectivity ratio of the first semiconductor films (silicon germanium) 11a-1 to 11d-3 with respect to the second semiconductor films (silicon) in the subsequent processes shown in FIGS. 8A to 8C.

Second Embodiment

A manufacturing method of a nonvolatile semiconductor storage device 1i according to the second embodiment is explained with reference to FIG. 11A to FIG. 12D. The cross-sectional views shown in FIGS. 11A and 11C and FIGS. 12A and 12C correspond to the cross-sectional view of FIG. 2A. The cross-sectional views shown in FIGS. 11A and 11C and FIGS. 12A and 12C illustrate cross sections cut along one-dot chain lines in the plan views of FIGS. 11B and 11D and FIGS. 12B and 12D, respectively. The cross-sectional view shown in FIG. 11E illustrates a cross section cut along a two-dot chain line in the plan view of FIG. 11D. In the followings, a portion different from the first embodiment is mainly explained.

Figure 11A:
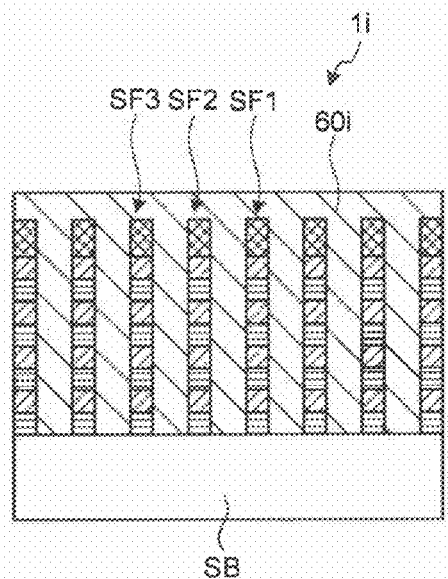
FIG. 11A to FIG. 11E are diagrams illustrating a manufacturing method of a nonvolatile semiconductor storage device according to a second embodiment.
Figure 11B:
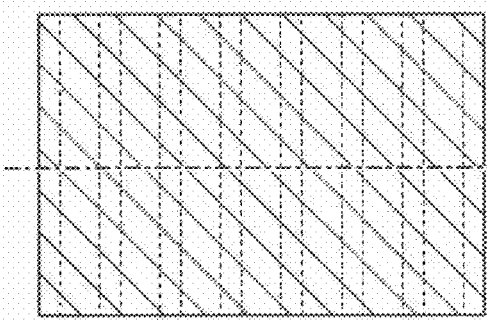

The processes shown in FIGS. 11A and 11B are performed next to the processes shown in FIGS. 4A to 4C. A dielectric film is embedded to cover the semiconductor substrate SB and the stacked films SF1 to SF3, and the upper surface of the embedded dielectric film is flattened by the CMP method or the like to form a dummy dielectric film 60i. The dummy dielectric film 60i is, for example, formed of silicon oxide.

Figure 11C:
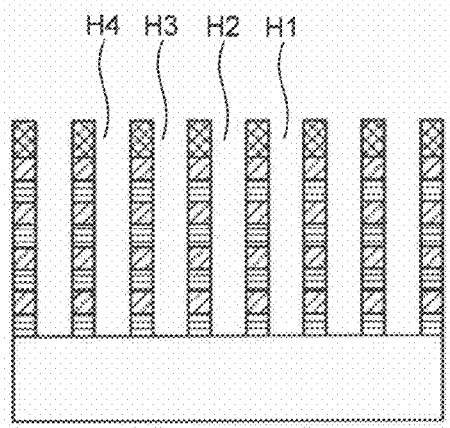
Figure 11D:
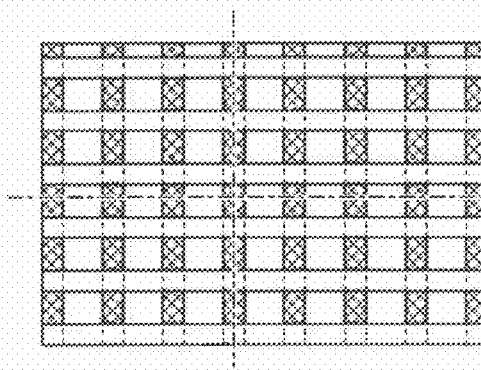
Figure 11E:
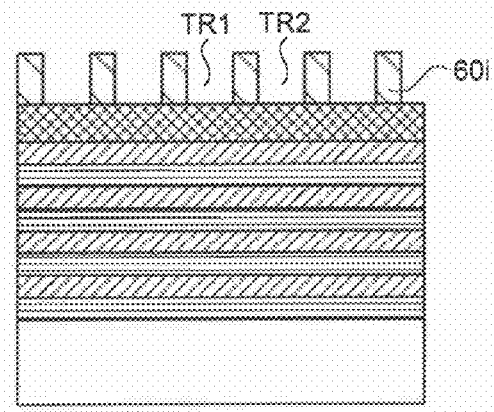

In the processes shown in FIGS. 11C to 11E, a third resist pattern (not shown) is formed on the dummy dielectric film 60i. The third resist pattern is a pattern in which the lines and the spaces in the second resist pattern used in the processes shown in FIGS. 7A to 7C in the first embodiment are inverted. Then, the dummy dielectric film 60i is subjected to the etching process (patterning) by the dry etching (for example, RIE) or the like with the third resist pattern as a mask. Whereby, holes H1 to H4 (see FIG. 11C) and trenches TR1 and TR2 (see FIG. 11E) for embedding the pillar members 21-1 to 22-4 and the word lines WL11 and WL21 are formed.

Figure 12A:
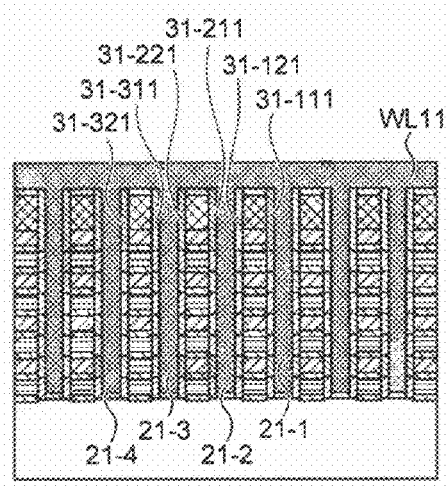
FIG. 12A to FIG. 12D are diagrams illustrating the manufacturing method of the nonvolatile semiconductor storage device according to the second embodiment.
Figure 12B:
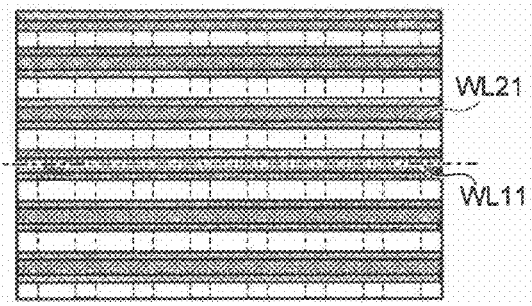

In the processes shown in FIGS. 12A and 12B, a dielectric film is deposited in the holes H1 to H4 and the trenches TR1 and TR2 to form the gate dielectric films 31-11 to 32-321. At this time, the gate dielectric films 31-11 to 32-321 are formed also on the inner surfaces of the trenches TR1 and TR2 (see FIG. 12B). Thereafter, a predetermined film is embedded in the holes H1 to H4 and the trenches TR1 and TR2, and the upper surface thereof is flattened by the CMP method or the like to form the pillar members 21-1 to 22-4 and the word lines WL11 and WL21. The predetermined film is formed of a semiconductor (for example, material whose main component is silicon). The predetermined film is, for example, formed of polysilicon.

Figure 12C:
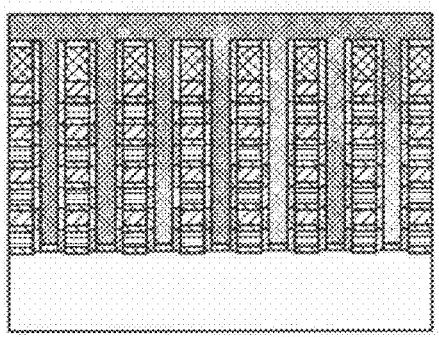
Figure 12D:
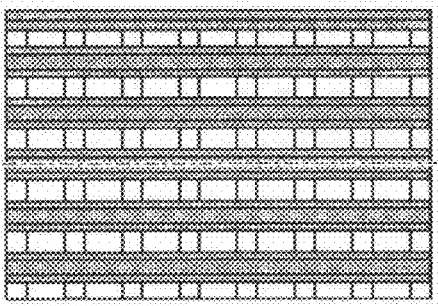

In the processes shown in FIGS. 12C and 12D, the dummy dielectric film 60i is removed by the dry etching (for example, RIE). Then, impurities are implanted into the side surfaces of the first semiconductor films 11a-1 to 11d-3 and the side surfaces of the second semiconductor films 12a-1 to 12d-3 of the stacked films SF1 to SF3, which are exposed, by the vapor-phase diffusion method, the ion implantation method, or the like to form source regions and drain regions (not shown), and the heat treatment for activation is performed. Thereafter, the processes after the processes shown in FIGS. 8A to 8C are performed.

In the second embodiment, each of the gate dielectric films 31-111 to 32-321, the pillar members 21-1 to 22-4, and the word lines WL11 and WL21 is formed by embedding the gate dielectric films 31-111 to 32-321 and the predetermined film in order in the holes H1 to H4 and the trenches TR1 and TR2. Therefore, each of the gate dielectric films 31-111 to 32-321, the pillar members 21-1 to 22-4, and the word lines WL11 and WL21 can be easily formed compared with the case of performing the etching process on the gate dielectric film 311 and the film 20 (see FIGS. 6A to 6E).

Third Embodiment

Figure 13A:
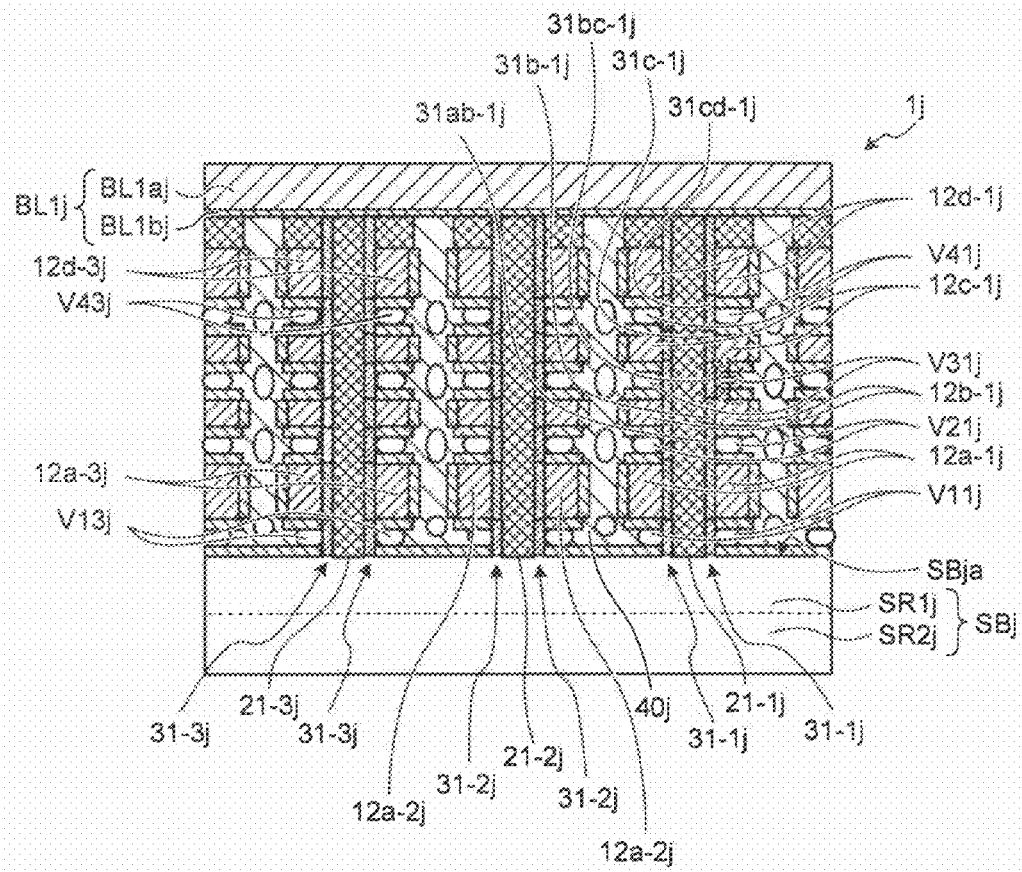
FIG. 13A and FIG. 13B are diagrams illustrating a configuration of a nonvolatile semiconductor storage device according to a third embodiment.
Figure 13B:
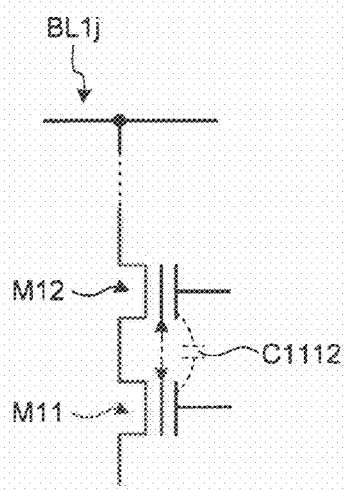

Next, a configuration of a nonvolatile semiconductor storage device 1j according to the third embodiment is explained with reference to FIG. 13A and FIG. 13B. FIG. 13A is a diagram illustrating a cross section including a bit line in the nonvolatile semiconductor storage device 1j. FIG. 13B is a diagram illustrating an equivalent circuit in the nonvolatile semiconductor storage device 1j. In the followings, a portion different from the first embodiment is mainly explained.

The nonvolatile semiconductor storage device 1j includes a semiconductor substrate SBj, a plurality of semiconductor films (second semiconductor films) 12a-1j to 12d-3j, a plurality of gate dielectric films 31-1j to 31-3j, a plurality of pillar members 21-1j to 21-3j, a plurality of bit lines BL1j and BL2j (see FIG. 15F), and an inter-layer dielectric film 40j.

The semiconductor substrate SBj includes an underlying region SR2j and a well region SR1j. The underlying region SR2j contains impurities (for example, boron) of the first conductivity type (for example, P-type) at a low concentration. The well region SR1j is formed on the underlying region SR2j. The well region SR1j contains impurities (for example, phosphorus and arsenic) of the second conductivity type (for example, N-type) opposite in conductivity type to the first conductivity type at a concentration higher than the concentration of the impurities of the first conductivity type in the underlying region SR2j. The well region SR1j functions as a source line.

The gate dielectric film 31-1j and the pillar member 21-1j penetrate through the stacked (arranged in a direction vertical to a surface SBja of the semiconductor substrate SBj) semiconductor films 12a-1j, 12b-1j, 12c-1j, and 12d-1j. Other stacked semiconductor films 12a-2j to 12d-3j are similar to the stacked semiconductor films 12a-1j, 12b-1j, 12c-1j, and 12d-1j.

Each of the semiconductor films 12a-1j to 12d-3j functions as the control gate of the transistor. For example, a portion of the semiconductor film 12b-1j that intersects with the pillar member 21-1j functions as the control gate of the transistor M11 (see FIG. 13B). For example, a portion of the semiconductor film 12c-1j that intersects with the pillar member 21-1j functions as the control gate of the transistor M12.

The gate dielectric films 31-1j to 31-3j penetrate through the semiconductor films 12a-1j to 12d-3j and are arranged on the peripheral surfaces of the semiconductor films 12a-1j to 12d-3j facing the holes that penetrate through the semiconductor films 12a-1j to 12d-3j. For example, the gate dielectric film 31-1j penetrates through the stacked semiconductor films 12a-1j, 12b-1j, 12c-1j, and 12d-1j and is arranged on the inner peripheral surfaces of the holes to be penetrated in the semiconductor films 12a-1j, 12b-1j, 12c-1j, and 12d-1j. Other gate dielectric films 31-2j and 31-3j are similar to the gate dielectric film 31-1j.

Each of the gate dielectric films 31-1j to 31-3j includes a charge trapping film having a dielectric constant (charge retention). Each of the gate dielectric films 31-1j to 31-3j is, for example, formed of an ONO film. The ONO film has a three-stacked-layer structure in which two silicon oxide films sandwich a silicon nitride film. Each of the gate dielectric films 31-1j to 31-3j includes the silicon nitride film in the ONO film as the charge trapping film and can trap charges in the silicon nitride film.

In the gate dielectric film 31-1j, the charge trapping film (silicon nitride film) in portions 31ab-1j, 31bc-1j, and 31cd-1j (see FIG. 15A) that do not intersect with the semiconductor films 12b-1j and 12c-1j is formed of a material (composition) that contains more oxygen than the charge trapping film (silicon nitride film) in portions 31b-1j and 31c-1j (see FIG. 15A) that intersect with the semiconductor films 12b-1j and 12c-1j. Whereby, in the gate dielectric film 31-1j, the dielectric constant (charge retention) of the portions 31ab-1j, 31bc-1j, and 31cd-1j that do not intersect with the semiconductor films 12b-1j and 12c-1j is lower than the dielectric constant (charge retention) of the portions 31b-1j and 31c-1j that intersect with the semiconductor films 12b-1j and 12c-1j. Other gate dielectric films 31-2j and 31-3j are similar to the gate dielectric film 31-1j.

The pillar members 21-1j to 21-3j penetrate through the semiconductor films 12a-1j to 12d-3j and hold the semiconductor films 12a-1j to 12d-3j via the gate dielectric films 31-1j to 31-3j. For example, the pillar member 21-1j penetrates through the stacked semiconductor films 12a-1j, 12b-1j, 12c-1j, and 12d-1j and holds the semiconductor film 12a-1j, 12b-1j, 12c-1j, and 12d-1j via the gate dielectric film 31-1j. Other pillar members 21-2j and 21-3j are similar to the pillar member 21-1j. Each of the pillar members 21-1j to 21-3j is formed of a semiconductor (for example, material whose main component is silicon). Each of the pillar members 21-1j to 21-3j is, for example, formed of polysilicon.

Each of the pillar members 21-1j to 21-3j functions as the active region. In other words, in the pillar members 21-1j to 21-3j, portions that intersect with the semiconductor films 12a-1j to 12d-3j become the channel regions of the transistors and portions adjacent to both sides (upper and lower) of these portions become the source regions or the drain regions of the transistors.

For example, in the pillar member 21-1j, portions that face (intersect with) the semiconductor films 12b-1j and 12c-1j become the channel regions of the transistors M11 and M12, respectively. For example, in the pillar member 21-1j, if the transistors M1 and M2 are NMOS transistors (PMOS transistors), a portion adjacent to the facing portion on the source line side becomes the source region (drain region), and a portion adjacent to the facing portion on the bit line side becomes the drain region (source region). The pillar members 21-1j to 21-3j are connected to the well region SR1j as the source line at one end and is connected to the bit line BL1j at the other end.

Each of the bit lines BL1j and BL2j (see FIG. 15F) extends in a direction that intersects with the longitudinal direction of each of the semiconductor films 12a-1j to 12d-3j along (for example, parallel to) the surface SBja of the semiconductor substrate SBj. The bit line BL1j connects the pillar members 21-1j to 21-3j that are arranged in a line along the surface SBja of the semiconductor substrate SBj. The bit line BL1j is formed of a conductive material and, for example, has a two-stacked-layer structure in which a barrier metal layer BL1bj and a metal layer BL1aj are stacked in order. The barrier metal layer BL1bj is, for example, formed of titanium nitride. The metal layer BL1aj is, for example, formed of tungsten. Another bit line BL2j is similar to the bit line BL1j.

The inter-layer dielectric film 40j includes voids V21j to V43j in respective regions between the semiconductor films 12a-1j to 12d-3j. Furthermore, the inter-layer dielectric film 40j includes voids V11j to V13j in the regions between the semiconductor substrate SBj and the semiconductor film 12a-1j to 12a-3j of the first layer. Each of the voids V11j to V43j extends in a doughnut shape to surround the pillar members 21-1j to 21-3j.

A case is assumed where the inter-layer dielectric film 40j does not include the voids V21j to V43j in respective regions between the semiconductor films 12a-1j to 12d-3j. In this case, in the three-dimensional array of the memory cells (transistors) of the nonvolatile semiconductor storage device 1*j*, if the interval between the transistors adjacent in the vertical direction is made small to improve the arrangement density of the memory cells (transistors), the coupling capacitance between the transistors adjacent in the vertical direction cannot be ignored. For example, in the configuration shown in FIG. 13B, if the interval between the transistor M11 and the transistor M12 that are adjacent in the vertical direction becomes small, a coupling capacitance C1112 between the semiconductor film (control gate) 12*b*-1*j* and the semiconductor film (control gate) 12*c*-1*j* that are stacked becomes large to a level that cannot be ignored. Consequently, the potential of the control gate of each of the transistors M11 and M12 becomes unstable due to the coupling capacitance between the transistor M11 and the transistor M12 that are adjacent in the vertical direction, so that each of the transistors M11 and M12 may malfunction.

On the contrary, in the third embodiment, the inter-layer dielectric film 40*j* includes the voids V21*j* to V43*j* in respective regions between the semiconductor films 12*a*-1*j* to 12*d*-3*j*. Whereby, even when the interval between the transistors adjacent in the vertical direction is made small, the coupling capacitance between the transistors adjacent in the vertical direction can be easily reduced to a level that can be ignored. For example, in the configuration shown in FIG. 13B, even if the interval between the transistor M11 and the transistor M12 that are adjacent in the vertical direction becomes small, the void V21*j* (see FIG. 13A) is formed between the semiconductor film (control gate) 12*b*-1*j* and the semiconductor film (control gate) 12*c*-1*j* that are stacked, so that the coupling capacitance C1112 between the semiconductor film (control gate) 12*b*-1*j* and the semiconductor film (control gate) 12*c*-1*j* can be easily reduced to a level that can be ignored. In other words, according to the third embodiment, in the configuration in which the transistors are three-dimensionally arranged, when the interval between the transistors adjacent in the vertical direction is made small, malfunction of the transistor due to the coupling capacitance can be reduced.

Alternatively, a case is assumed where the dielectric constant (charge retention) in the gate dielectric film 31-1*j* is uniformly distributed. In this case, when the interval between the transistors adjacent in the vertical direction is made small, charges may easily move between the transistors adjacent in the vertical direction. For example, if the dielectric constant (charge retention) of the portions 31*b*-1*j*, 31*bc*-1*j*, and 31*c*-1*j* (see FIG. 15A) in the gate dielectric film 31-1*j* is approximately equal, charges trapped in the portion 31*b*-1*j* in the gate dielectric film 31-1*j* can easily move to the portion 31*c*-1*j* via the portion 31*bc*-1*j*. Alternatively, charges trapped in the portion 31*c*-1*j* in the gate dielectric film 31-1*j* can easily move to the portion 31*b*-1*j* via the portion 31*bc*-1*j*. In other words, in the configuration shown in FIG. 13B, if the interval between the transistor M11 and the transistor M12 that are adjacent in the vertical direction becomes small, charges may easily move between the transistor M11 and the transistor M12 as indicated by a one-dot chain line arrow. Therefore, in the configuration in which the transistors are three-dimensionally arranged, when the interval between the transistors adjacent in the vertical direction is made small, each of the transistors M11 and M12 may malfunction due to the movement of charges (leak current).

On the contrary, in the third embodiment, in the gate dielectric film 31-1*j*, the dielectric constant (charge retention) of the portions 31*ab*-1*j*, 31*bc*-1*j*, and 31*cd*-1*j* that do not intersect with the semiconductor films 12*b*-1*j* and 12*c*-1*j* is lower than the dielectric constant (charge retention) of the portions 31*b*-1*j* and 31*c*-1*j* that intersect with the semiconductor films 12*b*-1*j* and 12*c*-1*j*. Whereby, even when the interval between the transistors adjacent in the vertical direction is made small, charges do not easily move between the transistors adjacent in the vertical direction. Consequently, in the configuration in which the transistors are three-dimensionally arranged, when the interval between the transistors adjacent in the vertical direction is made small, malfunction of the transistor due to the movement of charges (leak current) can be reduced.

A manufacturing method of the nonvolatile semiconductor storage device 1*j* according to the third embodiment is explained with reference to FIG. 14A to FIG. 15F. The cross-sectional views shown in FIGS. 14A, 14C, 14E, and 14G and FIGS. 15A, 15C, and 15E correspond to the cross-sectional view of FIG. 13A. The cross-sectional views shown in FIGS. 14A, 14C, 14E, and 14G and FIGS. 15A, 15C, and 15E illustrate cross sections cut along one-dot chain lines in the plan views of FIGS. 14B, 14D, 14F, and 14H and FIGS. 15B, 15D, and 15F, respectively. In the followings, a portion different from the first embodiment is mainly explained.

Figure 14A:
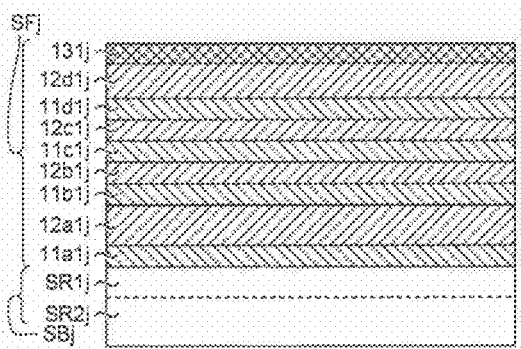
FIG. 14A to FIG. 14H are diagrams illustrating a manufacturing method of the nonvolatile semiconductor storage device according to the third embodiment.
Figure 14B:
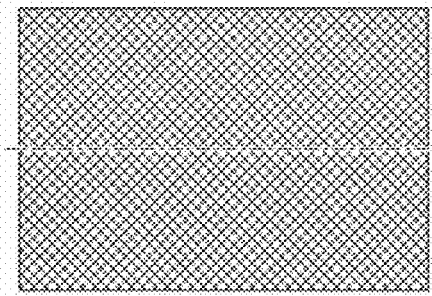

In the processes shown in FIGS. 14A and 14B, in the semiconductor substrate SBj, the well region SR1*j* is formed on the underlying region SR2*j*. The underlying region SR2*j* contains impurities (for example, boron) of the first conductivity type (for example, P-type) at a low concentration. The well region SR1*j* is formed to contain impurities (for example, phosphorus and arsenic) of the second conductivity type (for example, N-type) opposite in conductivity type to the first conductivity type at a concentration higher than the concentration of the impurities of the first conductivity type in the underlying region SR2*j*.

Then, a stacked film (stacked structure) SFj, in which first semiconductor films (first semiconductor layers) 11*a*1*j* to 11*d*1*j* and second semiconductor films (second semiconductor layers) 12*a*1*j* to 12*d*1*j* are stacked alternately, is formed on the semiconductor substrate SBj. Each of the second semiconductor films 12*a*1*j* to 12*d*1*j* is formed to contain impurities (for example, boron) of the first conductivity type (for example, P-type) at a concentration higher than the underlying region SR2*j*. Among the second semiconductor films 12*a*1*j* to 12*d*1*j* to be deposited, the lowermost second semiconductor film 12*a*1*j* and the uppermost second semiconductor film 12*d*1*j* are used as a gate electrode of a selection transistor and therefore are formed thicker than other second semiconductor film 12*b*1*j* and 12*c*1*j*.

Figure 14C:
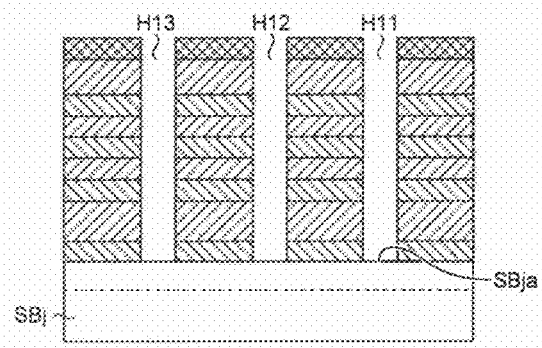
Figure 14D:
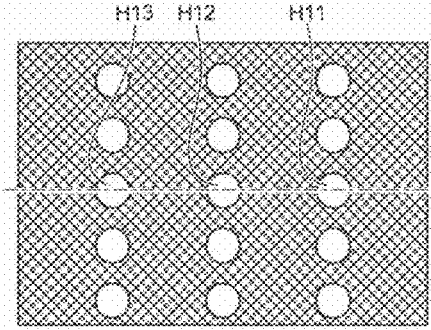

In the processes shown in FIGS. 14C and 14D, holes H11 to H13 that penetrate through the stacked film SFj and expose the surface SBja of the semiconductor substrate SBj are formed by the photolithography process and a processing process such as the dry etching (for example, RIE). The holes H11 to H13 are formed in a plurality of locations to be arrayed two dimensionally when viewed from a direction vertical to the surface SBja of the semiconductor substrate SBj.

Figure 14E:
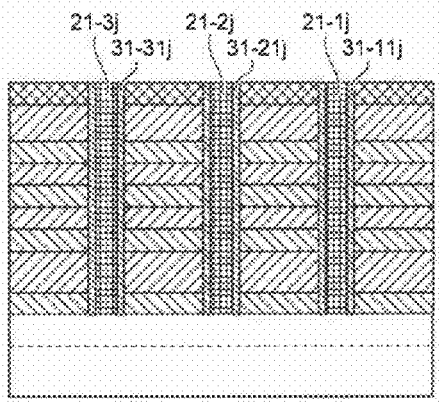
Figure 14F:
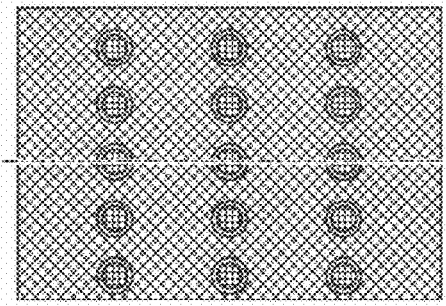

In the processes shown in FIGS. 14E and 14F, a dielectric film is deposited on the whole surface to cover the inner surfaces (for example, inner peripheral surfaces) of the holes H11 to H13. Then, portions that cover the bottom surfaces of the holes H11 to H13 are etched and removed while leaving portions of the deposited dielectric film that cover the inner surfaces (for example, inner peripheral surfaces) of the holes H11 to H13. Whereby, gate dielectric films 31-11*j* to 31-31*j* are formed on the inner surfaces (for example, inner peripheral surfaces) of the holes H11 to H13.

Then, a predetermined film is embedded in the holes H11 to H13 and the upper surface thereof is flattened by the CMP method or the like to form the pillar members 21-1*j* to 21-3*j*. The predetermined film is formed of a semiconductor (for example, material whose main component is silicon). The predetermined film is, for example, formed of polysilicon.

Figure 14G:
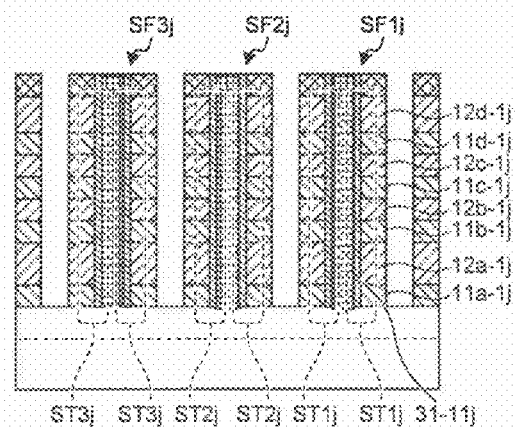
Figure 14H:
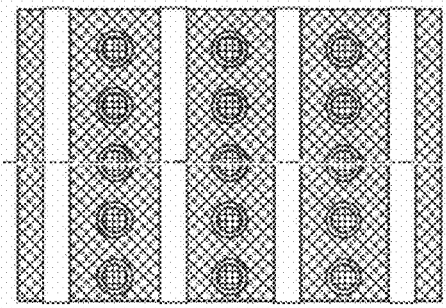

In the processes shown in FIGS. 14G and 14H, a fourth resist pattern (not shown) including a plurality of fourth line patterns arranged side by side with each other (for example, parallel to each other) is formed on the stacked film SFj by the photolithography process. Each fourth line pattern is formed as a row-shaped pattern to expose portions between the pillar members 21-1j to 21-3j when viewed from a direction vertical to the surface SBja of the semiconductor substrate SBj. Then, the stacked film SFj is subjected to the etching process by the dry etching (for example, RIE) or the like with the fourth resist pattern as a mask so that the stacked film (stacked structure) SFj is divided into a plurality of stacked films SF1j to SF3j. Whereby, the stacked films SF1j to SF3j are formed. Thereafter, the fourth resist pattern is removed.

In this manner, in the processes (forming process) shown in FIGS. 14A to 14H, a plurality of structures ST1j to ST3j (see FIG. 14G) is formed in which at least the second semiconductor films 12a-1j to 12d-3j in the stacked film SF1j to SF3j are held by the pillar members 21-1j to 21-3j via the gate dielectric films 31-11j to 31-31j. For example, in the structure ST1j, first semiconductor films 11a-1j to 11d-1j and the second semiconductor films 12a-1j to 12d-1j in the stacked film SF1j are held by the pillar member 21-1j (see FIG. 14E) via the gate dielectric film 31-11j. Other structures ST2j and ST3j are similar to the structure ST1j.

Figure 15A:
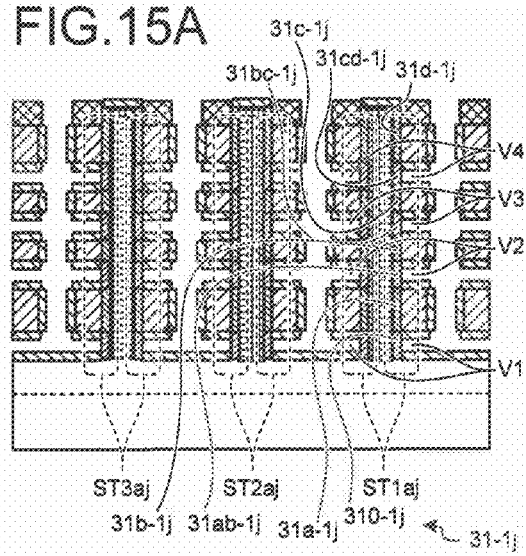
FIG. 15A to FIG. 15F are diagrams illustrating the manufacturing method of the nonvolatile semiconductor storage device according to the third embodiment.
Figure 15B:
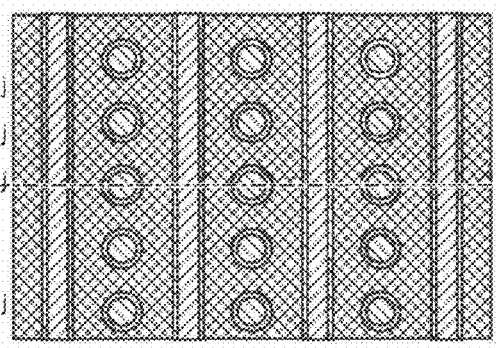

In the processes shown in FIGS. 15A and 15B, at first (removing process), in each of the structures ST1j to ST3j (see FIG. 14G), for example, the first semiconductor films 11a-1j to 11d-1j are selectively removed from the stacked film SF1j while maintaining the state where the second semiconductor films 12a-1j to 12d-3j are held by the pillar members 21-1j to 21-3j. Whereby, in a structure ST1aj having subjected to the removing process, the voids V21j to V41j are formed between the second semiconductor films 12a-1j to 12d-1j. Moreover, in the structure ST1aj having subjected to the removing process, the void V11j is formed between the lowermost second semiconductor film 12a-1j and the semiconductor substrate SBj. Other structures ST2aj and ST3aj subjected to the removing process are similar to the structure ST1aj.

In the next step (oxidation process), in each of the structures ST1aj to ST3aj (see FIG. 15A) having subjected to the removing process, the exposed surface is oxidized by the thermal oxidation method or the like. For example, in the gate dielectric film (ONO film) 31-11j, a region that was in contact with the first semiconductor films (silicon germanium) 11a-1j to 11d-1j is directly subjected to the thermal oxidation treatment, so that transformation of the silicon nitride film in the ONO film toward a silicon oxide film proceeds, and the dielectric constant (charge retention) of the silicon nitride film can be lowered. In other words, the gate dielectric film 31-1j is formed such that the charge trapping film (silicon nitride film) in the portions 310-1j, 31ab-1j, 31bc-1j, and 31cd-1j that do not intersect with the second semiconductor films 12a-1j to 12d-1j is formed of a material (composition) that contains more oxygen than the charge trapping film (silicon nitride film) in the portions 31a-1j, 31b-1j, 31c-1j, and 31d-1j that intersect with the second semiconductor films 12a-1j to 12d-1j. Whereby, in the obtained gate dielectric film 31-1j, the dielectric constant (charge retention) of the portions 310-1j, 31ab-1j, 31bc-1j, and 31cd-1j that do not intersect with the second semiconductor films 12a-1j to 12d-1j is lower than the dielectric constant (charge retention) of the portions 31a-1j, 31b-1j, 31c-1j, and 31d-1j that intersect with the second semiconductor films 12a-1j to 12d-1j. Other gate dielectric films 31-2j and 31-3j are similar to the gate dielectric film 31-1j.

Figure 15C:
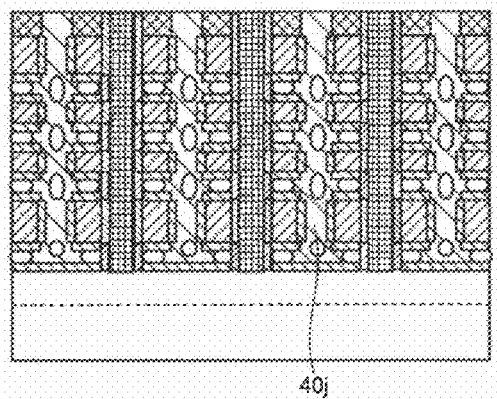
Figure 15D:
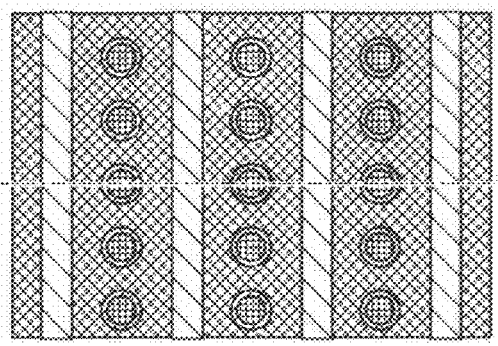

In the processes (embedding process) shown in FIGS. 15C and 15D, the inter-layer dielectric film 40j is embedded such that the voids V21j to V43j are left between the second semiconductor films 12a-1j to 12d-3j in the structures ST1aj to ST3aj (see FIG. 15A) having subjected to the removing process.

Figure 15E:
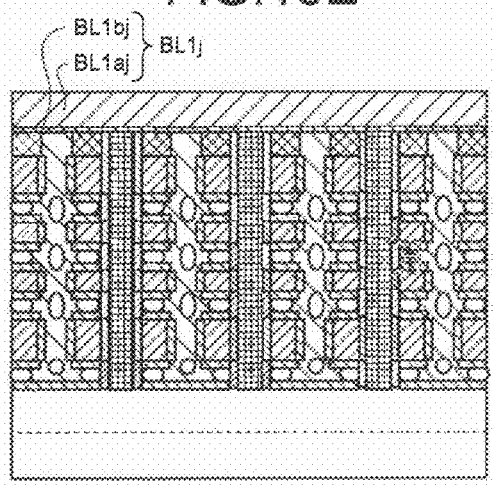
Figure 15F:

In the processes shown in FIGS. 15E and 15F, a barrier metal film and a metal film are deposited in order on the whole surface. The barrier metal film is, for example, formed of titanium nitride. The metal film is, for example, formed of tungsten. A fifth resist pattern (not shown) including a plurality of fifth line patterns that is arranged side by side with each other (for example, parallel to each other) and extends in a direction that intersects with the stacked films SF1j to SF3j is formed on the tungsten film. The fifth line patterns are formed to cover the pillar members 21-1j to 21-3j arranged in a line in a direction that intersects with the fourth line patterns when viewed from a direction vertical to the surface SBja of the semiconductor substrate SBj. Then, the barrier metal film and the metal film are subjected to the etching process by the dry etching (for example, RIE) or the like with the fifth resist pattern as a mask. Whereby, for example, the bit line BL1j in which the barrier metal film BL1bj and the metal film BL1aj are stacked in order is formed. In other words, the bit lines BL1j and BL2j are formed.

A case is assumed where, in the processes shown in FIGS. 14C and 14D, the first semiconductor films 11a1j to 11d1j are selectively removed from the stacked film SFj in which the holes H11 to H13 are formed. In this case, the gate dielectric films 31-11j to 31-31j and the predetermined film to be the pillar members 21-1j to 21-3j may be deposited in spaces formed between the second semiconductor films 12a1j to 12d1j in the processes shown in FIGS. 14E and 14F. Therefore, the spaces are filled with the gate dielectric films 31-11j to 31-31j and the predetermined film and thus it becomes difficult to form the voids V21j to V43j in the subsequent processes.

On the contrary, in the third embodiment, the first semiconductor films 11a1j to 11d1j are not removed in the processes shown in FIGS. 14C and 14D, and the first semiconductor films 11a-1j to 11d-1j are removed in the processes shown in FIGS. 15A and 15B that are processes after forming the pillar members 21-1j to 21-3j. Then, in the processes shown in FIGS. 15C and 15D, the inter-layer dielectric film 40j is embedded such that the voids V21j to V43j are left between the second semiconductor films 12a-1j to 12d-3j in the structures ST1aj to ST3aj having subjected to the removing process. Whereby, the nonvolatile semiconductor storage device 1j in which the transistors are three-dimensionally arranged and the inter-layer dielectric film 40j includes the voids V21j to V43j in the respective regions between the second semiconductor films (active regions) 12a-1j to 12d-3j can be manufactured.

In this case, even if the nonvolatile semiconductor storage device is formed such that the interval between the transistors adjacent in the vertical direction is made small, the coupling capacitance between the transistors adjacent in the vertical direction can be easily reduced to a level that can be ignored. For example, in the configuration shown in FIG. 13B, even if the interval between the transistor M11 and the transistor M12 that are adjacent in the vertical direction becomes small, the void V31j (see FIG. 13A) is formed between the semiconductor film (control gate) 12b-1j and the semiconductor film (control gate) 12c-1j that are stacked, so that the coupling capacitance C112 between the semiconductor film (control gate) 12b-1j and the semiconductor film (control gate) 12c-1j can be easily reduced to a level that can be ignored. In other words, according to the third embodiment, in the configuration in which the transistors are three-dimensionally arranged, when the interval between the transistors adjacent in the vertical direction is made small, malfunction of the transistor due to the coupling capacitance can be reduced.

Moreover, in the third embodiment, each of the second semiconductor films (control gates) $12a\text{-}1j$ to $12d\text{-}3j$ can be formed of single-crystal silicon. Whereby, resistance of the control gate of each transistor can be reduced.

Alternatively, a case is assumed where the processes shown in FIGS. 15C and 15D are performed without performing the process of oxidizing the exposed surfaces in each of the structures ST1$aj$ to ST3$aj$ having subjected to the removing process. In this case, the dielectric constant (charge retention) in the gate dielectric films $31\text{-}1j$ to $31\text{-}3j$ becomes uniformly distributed, so that if the interval between the transistors adjacent in the vertical direction is made small, charges may easily move between the transistors adjacent in the vertical direction. For example, if the dielectric constant (charge retention) of the portions $31b\text{-}1j$, $31bc\text{-}1j$, and $31c\text{-}1j$ in the gate dielectric film $31\text{-}1j$ is approximately equal, charges trapped in the portion $31b\text{-}1j$ in the gate dielectric film $31\text{-}1j$ can easily move to the portion $31c\text{-}1j$ via the portion $31bc\text{-}1j$. Alternatively, charges trapped in the portion $31c\text{-}1j$ in the gate dielectric film $31\text{-}1j$ can easily move to the portion $31b\text{-}1j$ via the portion $31bc\text{-}1j$. In other words, in the configuration shown in FIG. 13B, if the interval between the transistor M11 and the transistor M12 that are adjacent in the vertical direction becomes small, charges may easily move between the transistor M11 and the transistor M12 as indicated by a one-dot chain line arrow. Therefore, in the configuration in which the transistors are three-dimensionally arranged, when the interval between the transistors adjacent in the vertical direction is made small, each of the transistors M11 and M12 may malfunction due to the movement of charges (leak current).

On the contrary, in the third embodiment, the processes shown in FIGS. 15C and 15D are performed after performing the process of oxidizing the exposed surfaces in each of the structures ST1$aj$ to ST3$aj$ having subjected to the removing process. In other words, in the process of oxidizing the exposed surfaces, in the structures ST1$aj$ to ST3$aj$ (see FIG. 15A) having subjected to the removing process, the exposed surfaces in the gate dielectric films $31\text{-}11j$ to $31\text{-}31j$ (see FIG. 14E) are oxidized by the thermal oxidation method or the like such that the voids V21$j$ to V43$j$ are left between the second semiconductor films $12a\text{-}1j$ to $12d\text{-}3j$. For example, in the gate dielectric film (ONO film) $31\text{-}11j$, a region that was in contact with the first semiconductor films (silicon germanium) $11a\text{-}1j$ to $11d\text{-}1j$ is directly subjected to the thermal oxidation treatment, so that transformation of the silicon nitride film in the ONO film toward a silicon oxide film proceeds, and the dielectric constant (charge retention) of the silicon nitride film can be lowered. In other words, in the gate dielectric film $31\text{-}1j$ formed by the process of oxidizing the exposed surfaces, the dielectric constant (charge retention) of the portions $31ab\text{-}1j$, $31bc\text{-}1j$, and $31cd\text{-}1j$ that do not intersect with the semiconductor films $12b\text{-}1j$ and $12c\text{-}1j$ is lower than the dielectric constant (charge retention) of the portions $31b\text{-}1j$ and $31c\text{-}1j$ that intersect with the semiconductor films $12b\text{-}1j$ and $12c\text{-}1j$. Whereby, even when the interval between the transistors adjacent in the vertical direction is made small, charges do not move easily between the transistors adjacent in the vertical direction. Consequently, in the configuration in which the transistors are three-dimensionally arranged, when the interval between the transistors adjacent in the vertical direction is made small, malfunction of the transistor due to the movement of charges (leak current) can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a semiconductor substrate;
a plurality of semiconductor films that is stacked while being spaced from each other in a direction vertical to a surface of the semiconductor substrate, above the semiconductor substrate;
a plurality of gate dielectric films, each extending in the direction vertical to the surface of the semiconductor substrate and being arranged on side surfaces of the plurality of semiconductor films; and
a plurality of semiconductor or conductor pillar members, each extending in the direction vertical to the surface of the semiconductor substrate and facing the plurality of semiconductor films via each of the gate dielectric films,
wherein a dielectric constant of a portion of each of the gate dielectric films that does not intersect with the semiconductor films is lower than a dielectric constant of a portion of each of the gate dielectric films that intersects with the semiconductor films.

2. The nonvolatile semiconductor storage device according to claim 1, wherein
each of the gate dielectric films has a charge trapping film, and
an oxygen content of the charge trapping film of the portion that does not intersect with the semiconductor films is larger than an oxygen content of the charge trapping film of the portion that intersects with the semiconductor films.

3. The nonvolatile semiconductor storage device according to claim 1, further comprising an inter-layer dielectric film having a void in each region between the semiconductor films.

4. A nonvolatile semiconductor storage device comprising:
a semiconductor substrate;
a plurality of semiconductor films that is stacked while being spaced from each other in a direction vertical to a surface of the semiconductor substrate, above the semiconductor substrate;
a plurality of gate dielectric films, each penetrating through the plurality of semiconductor films and being arranged on an inner peripheral surface of a hole to be penetrated in the semiconductor films; and
a plurality of semiconductor pillar members, each penetrating through the plurality of semiconductor films and facing the plurality of semiconductor films via each of the gate dielectric films,
wherein a dielectric constant of a portion of each of the gate dielectric films that does not intersect with the semiconductor films is lower than a dielectric constant of a portion of each of the gate dielectric films that intersects with the semiconductor films.

5. The nonvolatile semiconductor storage device according to claim 4, wherein
   each of the gate dielectric films has a charge trapping film, and
   an oxygen content of the charge trapping film of the portion that does not intersect with the semiconductor films is larger than an oxygen content of the charge trapping film of the portion that intersects with the semiconductor films.

6. The nonvolatile semiconductor storage device according to claim 4, further comprising an inter-layer dielectric film having a void in each region between the plurality of semiconductor films.

* * * * *